US011569617B2

(12) United States Patent
Wig

(10) Patent No.: US 11,569,617 B2
(45) **Date of Patent: *Jan. 31, 2023**

(54) PINFIELD WITH GROUND VIAS ADJACENT TO AN AUXILIARY SIGNAL CONDUCTOR FOR CROSSTALK MITIGATION

(71) Applicant: Intel Corporation, Santa Clara, CA (US)

(72) Inventor: Timothy Wig, Northborough, MA (US)

(73) Assignee: Intel Corporation, Santa Clara, CA (US)

(*) Notice: Subject to any disclaimer, the term of this patent is extended or adjusted under 35 U.S.C. 154(b) by 137 days.

This patent is subject to a terminal disclaimer.

(21) Appl. No.: 16/949,194

(22) Filed: Oct. 19, 2020

(65) Prior Publication Data

US 2021/0036464 A1 Feb. 4, 2021

Related U.S. Application Data

(63) Continuation of application No. 16/043,091, filed on Jul. 23, 2018, now Pat. No. 10,811,823, which is a continuation of application No. 14/865,220, filed on Sep. 25, 2015, now Pat. No. 10,038,281.

(60) Provisional application No. 62/204,575, filed on Aug. 13, 2015.

(51) Int. Cl.
*H05K 1/18* (2006.01)
*H01R 13/6471* (2011.01)
*H01R 12/71* (2011.01)

(52) U.S. Cl.
CPC ....... *H01R 13/6471* (2013.01); *H01R 12/718* (2013.01)

(58) Field of Classification Search
CPC .... H05K 1/14; H05K 1/141-144; H05K 1/18; H05K 1/181-187; H05K 3/336; H01R 12/718; H01R 13/476; H01R 13/6587
USPC .......................................... 361/771-777, 803
See application file for complete search history.

(56) References Cited

U.S. PATENT DOCUMENTS

| | | | |
|---|---|---|---|
| 6,384,341 | B1 | 5/2002 | Rothermel et al. |
| 8,002,581 | B1 | 8/2011 | Whiteman et al. |
| 8,183,466 | B2 | 5/2012 | Morlion et al. |
| 9,974,161 | B2 | 5/2018 | Wig et al. |

(Continued)

FOREIGN PATENT DOCUMENTS

| | | | |
|---|---|---|---|
| CN | 202196909 | U | 4/2012 |
| CN | 203930839 | U | 11/2014 |

(Continued)

OTHER PUBLICATIONS

International Preliminary Report on Patentability for Application No. PCT/US2016/041953, dated Feb. 22, 2018, 8 Pages.

(Continued)

*Primary Examiner* — Tuan T Dinh
(74) *Attorney, Agent, or Firm* — Alliance IP, LLC

(57) ABSTRACT

A system board is provided that includes a connector. The connector includes a pinfield. The pinfield includes a set of differential signal conductors to correspond to pins of a set of differential signaling pairs; a set of one or more auxiliary signal conductors to carry auxiliary signals; and a plurality of thru-hole ground vias adjacent to a particular one of the auxiliary signal conductors in the set of auxiliary signal conductors.

26 Claims, 17 Drawing Sheets

(56) References Cited

U.S. PATENT DOCUMENTS

| | | | | |
|---|---|---|---|---|
| 2005/0277221 | A1 | 12/2005 | Mongold et al. | |
| 2006/0090933 | A1* | 5/2006 | Wig | H05K 1/115 174/262 |
| 2006/0264112 | A1 | 11/2006 | Nagahashi | |
| 2007/0269998 | A1 | 11/2007 | Daly et al. | |
| 2008/0250377 | A1* | 10/2008 | Bird | G01R 31/2818 324/754.01 |
| 2009/0188711 | A1* | 7/2009 | Ahmad | H05K 1/116 174/262 |
| 2012/0003848 | A1 | 1/2012 | Casher et al. | |
| 2012/0058684 | A1 | 3/2012 | Geest et al. | |
| 2012/0156938 | A1 | 6/2012 | Zhang | |
| 2013/0005160 | A1 | 1/2013 | Minich | |
| 2013/0199834 | A1 | 8/2013 | Geest et al. | |
| 2013/0215587 | A1 | 8/2013 | Kawai | |
| 2014/0141654 | A1 | 5/2014 | Wig et al. | |
| 2014/0209370 | A1 | 7/2014 | Minich | |

FOREIGN PATENT DOCUMENTS

| | | | |
|---|---|---|---|
| JP | 2005518067 | A | 6/2005 |
| WO | 2017027154 | A1 | 2/2017 |

OTHER PUBLICATIONS

International Search Report and Written Opinion in PCT Application No. PCT/US2016/041953 dated Oct. 19, 2016, 11 pages.

State Intellectual Property Office; First Office Action issued for Chinese Patent Application No. CN 201680041162.7, dated Apr. 24, 2019; 7 pages, no English translation.

State Intellectual Property Office; Second Office Action issued for Chinese Patent Application No. CN 201680041162.7, dated Sep. 30, 2019; 3 pages, no English translation.

German Patent Office; Office Action issued in German Patent Application No. 112016003693.0, dated Aug. 25, 2022, 10 pages.

* cited by examiner

PINFIELD WITH GROUND VIAS ADJACENT TO AN AUXILIARY SIGNAL CONDUCTOR FOR CROSSTALK MITIGATION

CROSS REFERENCE TO RELATED APPLICATIONS

This application is a continuation of U.S. patent application Ser. No. 16/043,091, filed Jul. 23, 2018, which is a continuation of U.S. patent application Ser. No. 14/865,220, filed Sep. 25, 2015, which claims benefit to U.S. Provisional Patent Application Ser. No. 62/204,575, filed Aug. 13, 2015, the contents of which are incorporated by reference herein in their entirety.

FIELD

This disclosure pertains to computing system, and in particular (but not exclusively) connections to facilitate electronic communication.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Further, as the demand for future high performance processors increases, demand grows for interconnect architectures capable of supporting the corresponding high data rates made available by next generation processors.

DETAILED DESCRIPTION

Figure 1:
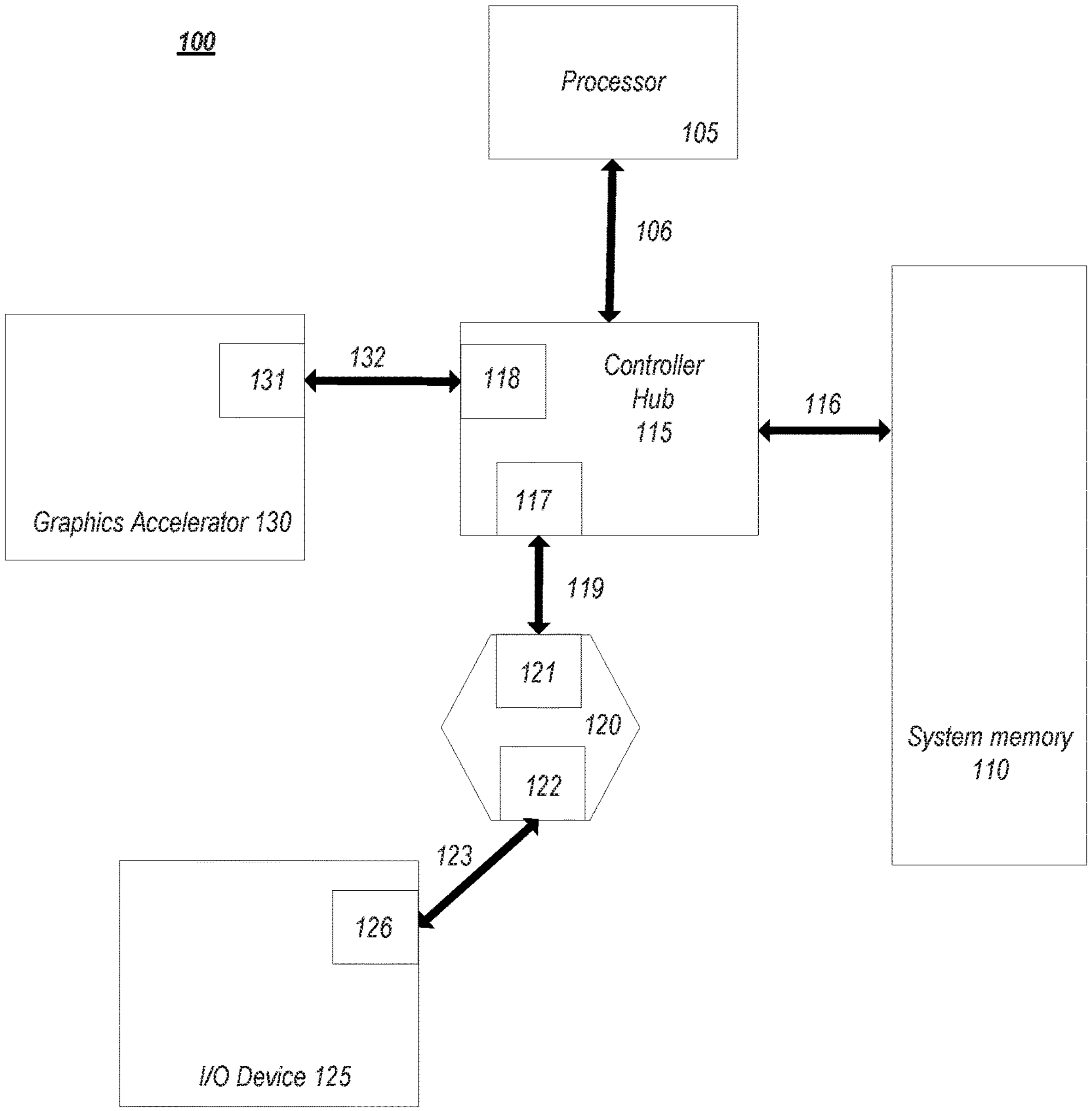
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard. One or more components of the system 100 can be provided with logic to implement the features described herein.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
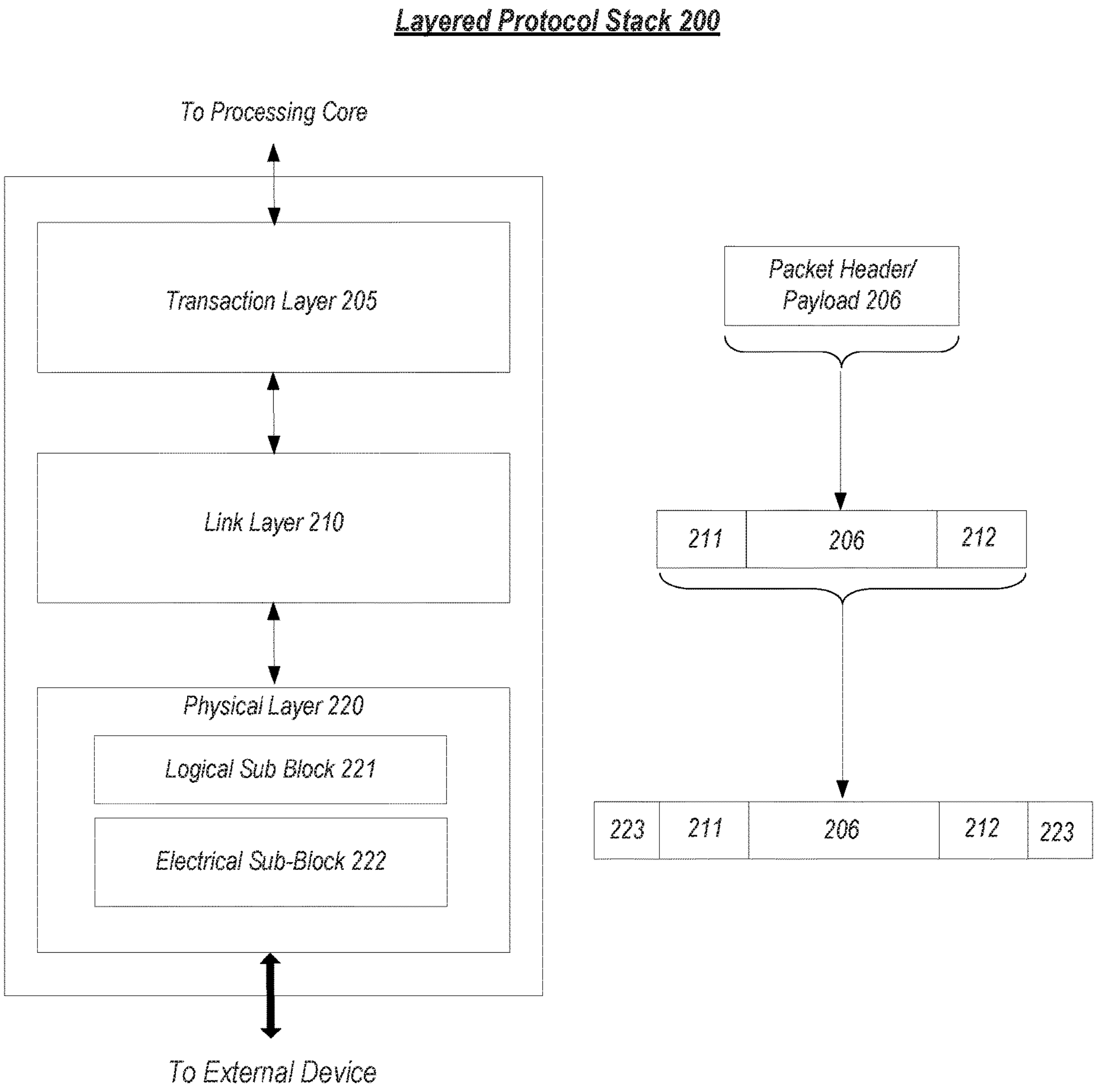
FIG. 2 illustrates an embodiment of a interconnect architecture including a layered stack.

Turning to FIG. 2 an embodiment of a layered protocol stack is illustrated. Layered protocol stack 150 includes any form of a layered communication stack, such as a Quick Path Interconnect (QPI) stack, a PCIe stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 150 is a PCIe protocol stack including transaction layer 155, link layer 210, and physical layer 220. An interface, such as interfaces 117, 118, 121, 122, 126, and 131 in FIG. 1, may be represented as communication protocol stack 150. Representation as a communication protocol stack may also be referred to as a module or interface implementing/including a protocol stack.

PCI Express uses packets to communicate information between components. Packets are formed in the Transaction Layer 155 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 155 of the receiving device.

Transaction Layer

In one embodiment, transaction layer 155 is to provide an interface between a device's processing core and the interconnect architecture, such as data link layer 210 and physical layer 220. In this regard, a primary responsibility of the transaction layer 155 is the assembly and disassembly of packets (i.e., transaction layer packets, or TLPs). The translation layer 155 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 155. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message transactions are defined to support in-band communication between PCIe agents.

Therefore, in one embodiment, transaction layer 155 assembles packet header/payload 156. Format for current packet headers/payloads may be found in the PCIe specification at the PCIe specification website.

Figure 3:
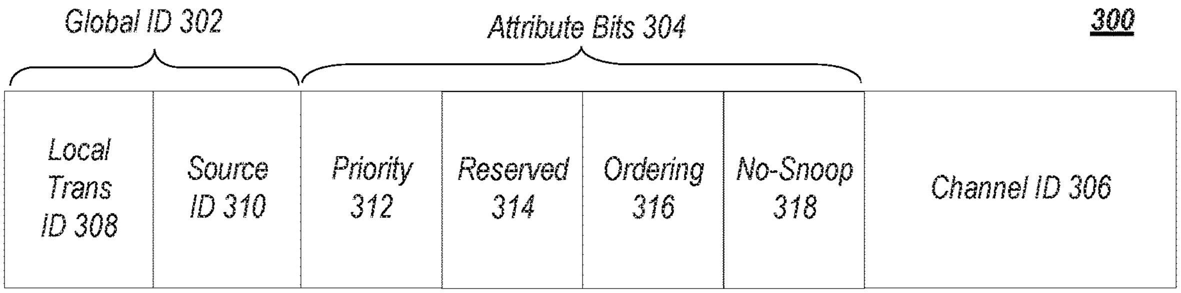
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 155 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 155, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 155, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
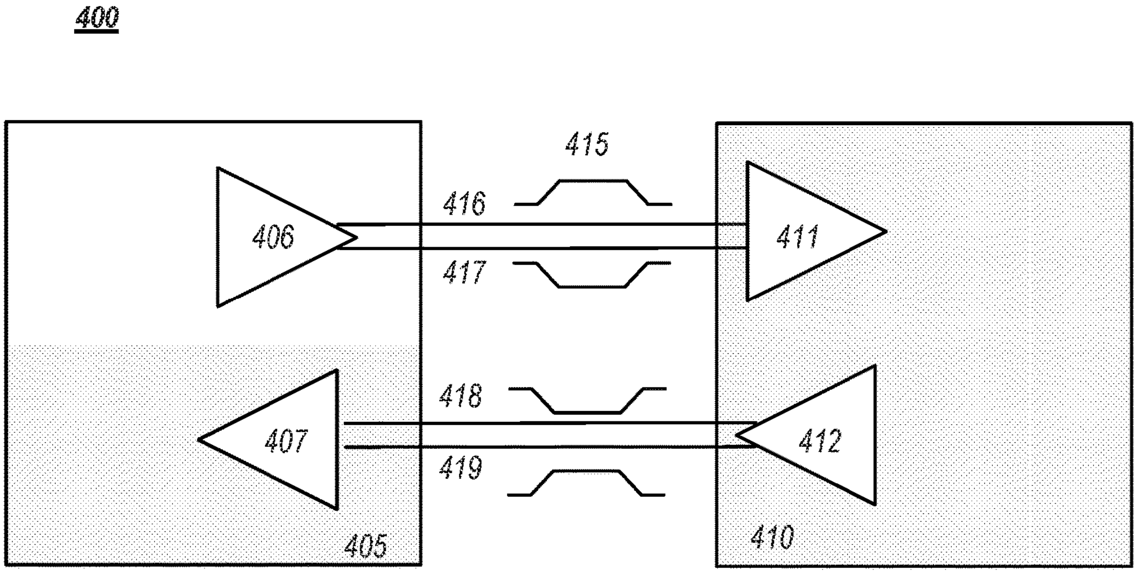
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Some systems can include connectors to allow additional computing components to be added to the system, such as graphics cards, processor cards, memory cards, I/O cards, etc. A circuit board, such as a motherboard or baseboard can include one or more connectors to accept an expansion or add-in card. One of a variety of compatible cards can be mounted to a baseboard using the connector so as to communicatively couple the card to the board by one of a set of conductors. A pin field can be provided on the connector through which the electrical connections can be facilitated. An add-card can be configured for a specific purpose, so as to extend functionality of the computer to which it is connected (e.g., through the computer's baseboard). In one example implementation, the add-in card comprises a device compatible with a PCI-based interconnect protocol, such as PCIe. In examples such as PCIe or other technologies, communications can involve differential signaling using differential conductor pairs provided in the pin field of the connector.

Figure 5:
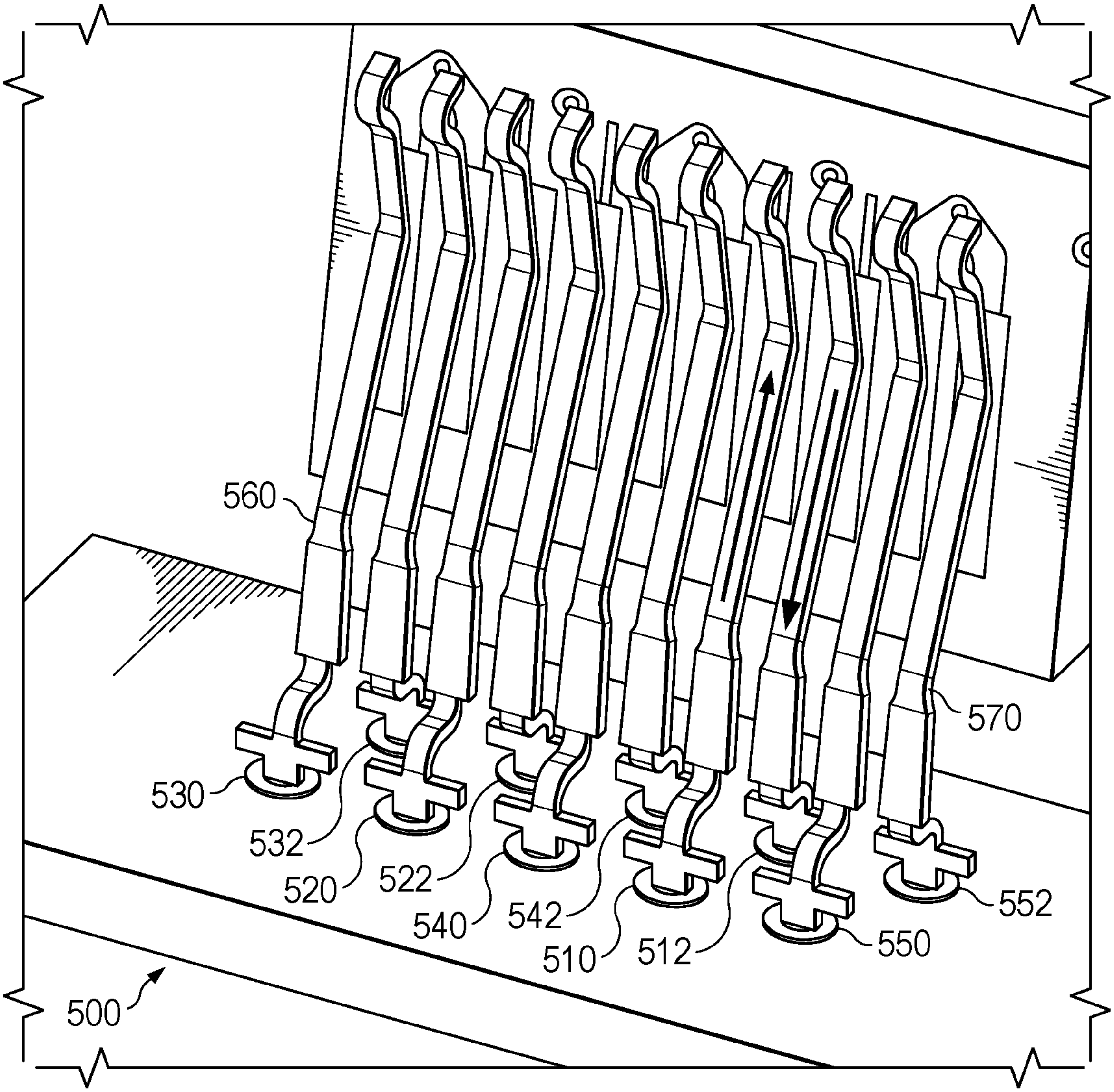
FIG. 5 illustrates a representation of an example connector interface including one or more sideband conductors.

FIG. 5 illustrates a magnified view of an example connector. Specifically, in this example, a portion of a PCIe connector 500 is shown that includes a mechanism for accepting an add-in card (AIC), securing the AIC to the baseboard, and electrically connecting the AIC to a baseboard (and potentially other devices mounted to the baseboard) through a pin field. The pin fields can include or conductively support pins that couple to conductors on the AIC. In some implementations, the pins can be designated to carry clock, sideband, and data signals. Other pins can be designated as ground pins (and can be connected to one or more ground planes associated with the connector). In some instances, data signals can be differential signals, with pairs of conductors (and pins) used to carry the differential data, as in PCIe.

In one example of a connector, all contacts are electrically isolated from one another by airspace and a plastic connector shell. In this example, conductors 510 and 512 represent a first differential pair, capable of carrying equal and opposite currents to balance the signal integrity effects. Conductors 520 and 522 represent a second differential pair. Ground conductor pairs 530 and 532, 540 and 542, and 550 and 552 are joined only at the printed circuit board (PCB) level (baseboard and AIC). In some implementations, a ground conductor (e.g., 542) adjacent to a signal conductor (e.g., 510) of a differential pair may balance some of the return current (in addition to 512). (It should be noted that in other implementations the signals are not differential. This, however, does not necessarily limit the applicability of the concepts described herein, as the above concepts can be applied to other systems, including signals that are non-differential signals.)

As noted above, the principles described above can be applied to connections, devices, and systems compliant with a PCIe-based specification. For instance, in the case of PCIe Gen4, data rates may meet or exceed 16 GT/s. To support PCIe Gen4 traffic the frequency bandwidth may generally be considered to span the 0-8 GHz range. This exceeds the bandwidth of previous PCIe versions' connector interface, (e.g., where the PCIe Gen 3 Card Electromechanical Spec (CEM Spec) and common PCIe Gen 1-2-3 PCB design techniques are applied). In the pursuit of Gen4 readiness, numerous channel impairments that limit the performance of the connector have been identified (e.g., through electromagnetic component simulation as well as simulation at the channel level, and subsequently confirmed in hardware, using vector network analysis) that did not meaningfully affect PCIe Gen1-2-3 channels. Accordingly, there is a desire to develop enhanced PCIe connectors (and other high speed interconnect connectors) capable of handling the high data rates of next generation interconnects and corresponding processors, among other example issues.

As shown in FIG. 5, a connector can include multiple conductors (e.g., implemented as pins (e.g., 560, 570)

inserted into the conductive holes, or vias, of a circuit board for use in connecting to pins (e.g., 530, 552) of a pin field). Among the conductors, several sideband pins may be provided among the high speed differential pairs and grounds to provide various sideband functions. In some cases, sideband pins can be reserved pins, such as in cases where a use for sideband signaling has not yet been developed for a given device (e.g., AIC). In some implementations, sideband signals to be carried on the sideband pins of a connector can be assumed to be lower speed signals, compared with high speed differential pair pins and clock pins of the connector. For instance, sideband pins can be assigned to low speed, reference clock, or DC signals. The corresponding sideband conductors can exhibit a resonance that generates a strong crosstalk peak which can affect signal integrity of neighboring data (e.g., differential) lanes and pins. Such crosstalk can lead to symbol errors and other issues. In one example, crosstalk peaks exhibited on sideband conductors can falls at about 5 GHz, in the middle of the 0-8 GHz bandwidth of Gen4. This resonance also manifests as a corresponding dropout in insertion loss at the same frequency. The resonance can result from electromagnetic coupling among the conducting pin field vias, connector pins and contacts, and add-in card (AIC) edge fingers, combined with the fact that these conductors are typically unterminated, or terminated in a highly mismatched impedance. This resonance is present in both surface mount and thru-hole versions of the PCIe connector, and in x1, x4, x8, and x16 widths. The crosstalk effects of the resonance can manifest particularly within the circuit board of the connector (e.g., through which the pin field vias are formed), due to the higher coupling among the vias.

In some implementations, the systems described above can be implemented to include features to reduce crosstalk within a connector pin field and address at least some of the example issues introduced above. Among the example benefits of such features, insertion loss and mode conversion of the connector can be improved. Accordingly, crosstalk effects can be reduced to enhance signal quality of neighboring data lanes. Such solutions can be applied to connector pin fields including those defined in PCIe and PCIe-based specifications, as well as other interconnect specifications.

For instance, in the example of PCIe-compliant connectors, some pin positions in the PCIe pin field suffer much higher broadband crosstalk than others. This crosstalk does not originate in the connector body itself. Instead, it stems from the irregular PCIe connector pin field signal assignment, where the via to via crosstalk among particular pin pairs in the connector's baseboard pin field is markedly higher than at other locations. This issue has been shown to greatly degrade channel performance in the affected lanes. Since the overall bus performance of the connector link is limited by the performance of its worst lanes, remediation of this crosstalk is particularly beneficial for PCIe Gen4 and other high-speed interconnects utilizing sideband signaling.

In some implementations, a desired pin field (e.g., a PCIe pin field) for a set of high speed differential pairs ideally constitutes a Ground-Ground-Signal-Signal-Ground-Ground pattern. In such cases, each differential pair can thus be viewed as having four ground return paths; each comprising the baseboard vias, the connector contact, and the mating add-in card. In such instances, the each differential pair is effectively "surrounded" by ground conductors, which assists in insulating the differential pair from crosstalk effects from other lanes and corresponding pins. In some cases, these four ground conductors can be sufficient to reduce broadband crosstalk and prevent mode conversion.

In real world pin fields, the Ground-Ground-Signal-Signal-Ground-Ground pattern can be broken through the provision of the occasional sideband pins for corresponding sideband channels. For instance, at other positions, the differential pair may have only two or three adjacent ground return paths. This is due to sideband signals that may be assigned to Clock Request #, Power Break #, or multiple Present2 # and Reserved pins. Each of these sideband signals effectively displaces a ground conductor and interrupts the Ground-Ground-Signal-Signal-Ground-Ground pattern. This issue is present, for instance, in every connector that uses the PCIe CEM spec mandated pin field pattern, and in every PCIe connector length, including the x1, x4, x8, and x16 styles, among other examples.

Figure 6:
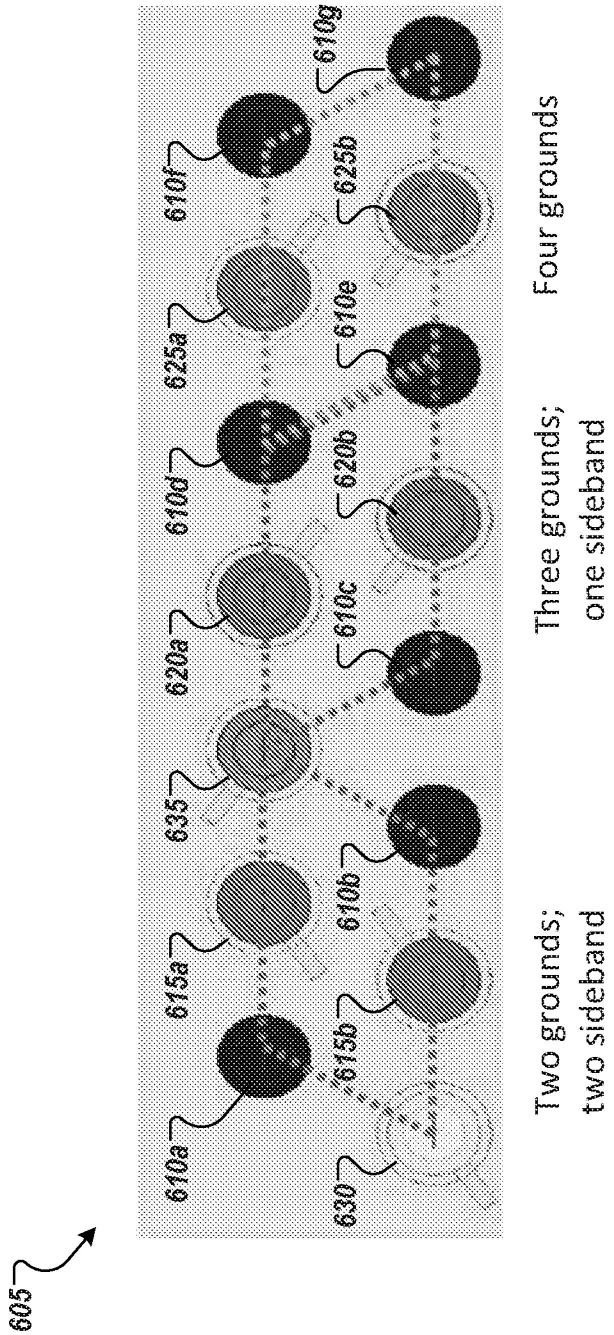
FIG. 6 illustrates a representation of a pin field of an example connector including one or more sideband conductors.

FIG. 6 illustrates the problem for three adjacent differential pairs, Tx0, Tx1, and Tx2. The black circles represent ground pins. FIG. 6 illustrates an example where sideband pins interrupt a Ground-Ground-Signal-Signal-Ground-Ground pattern such that the sideband pins displace a ground to be situated between adjacent differential pin pairs. For instance, a portion 605 of a via array of a connector pin field is shown that includes a collection, or array, of vias (e.g., 610*a-g*, 615*a-b*, 620*a-b*, 625*a-b*, 630, 635) to accept corresponding conductive connector pins. In other instances, the pins can be integrated into a board (in lieu of a separate via). For purposes of simplicity in describing the concepts herein, the term "pin" is used to alternatively (or collectively) describe pins as well as board vias to support said pins (where relevant). Similarly, the term "pin field" is interchangeably used to refer to a collection of pins mounted to a board and via arrays configured to accept pins and implement a pin field.

In the example of FIG. 6, a portion of a pin field 605 is shown that includes ground pins (e.g., 610*a-g*) and multiple differential pin pairs (e.g., 615*a-b*, 620*a-b*, 625*a-b*). In some cases, both pins adjacent to each of the pins within a differential pin pair can be ground pins. For instance, in the example of FIG. 6, differential pin pair 625*a-b* can be part of an idealized Ground-Ground-Signal-Signal-Ground-Ground pattern, with the ground pins 610*d-g* positioned between each of the differential pair pins 625*a-b* and the next adjacent pin pair (e.g., 620*a-b*). On the other hand, sideband pins 630, 635 can interrupt the Ground-Ground-Signal-Signal-Ground-Ground pattern for other differential pair pins. For instance, rather than providing a ground pin between pin 620*a* (of pair 620*a-b*) and pin 615*a* (of pair 615*a-b*), sideband pin 635 can be provided. The Ground-Ground-Signal-Signal-Ground-Ground pattern can also be upset by changes in the orientation of the pin pairs. For instance, while pin pairs 620*a-b* and 625*a-b* may be oriented parallel to each other, pin pair 615*a-b* may be oriented differently. In this example, this difference in orientation can also include the provision of more than one ground pin (e.g., 610*b-c*) between adjacent differential pins (e.g., 615*b*, 620*b*), among other divergences from the Ground-Ground-Signal-Signal-Ground-Ground pattern. As noted above, such divergences can result in the development of potentially disadvantageous signaling characteristics, such as crosstalk and resonance resulting from the presence of a sideband pin where a ground pin would be ideally positioned.

Figure 7:
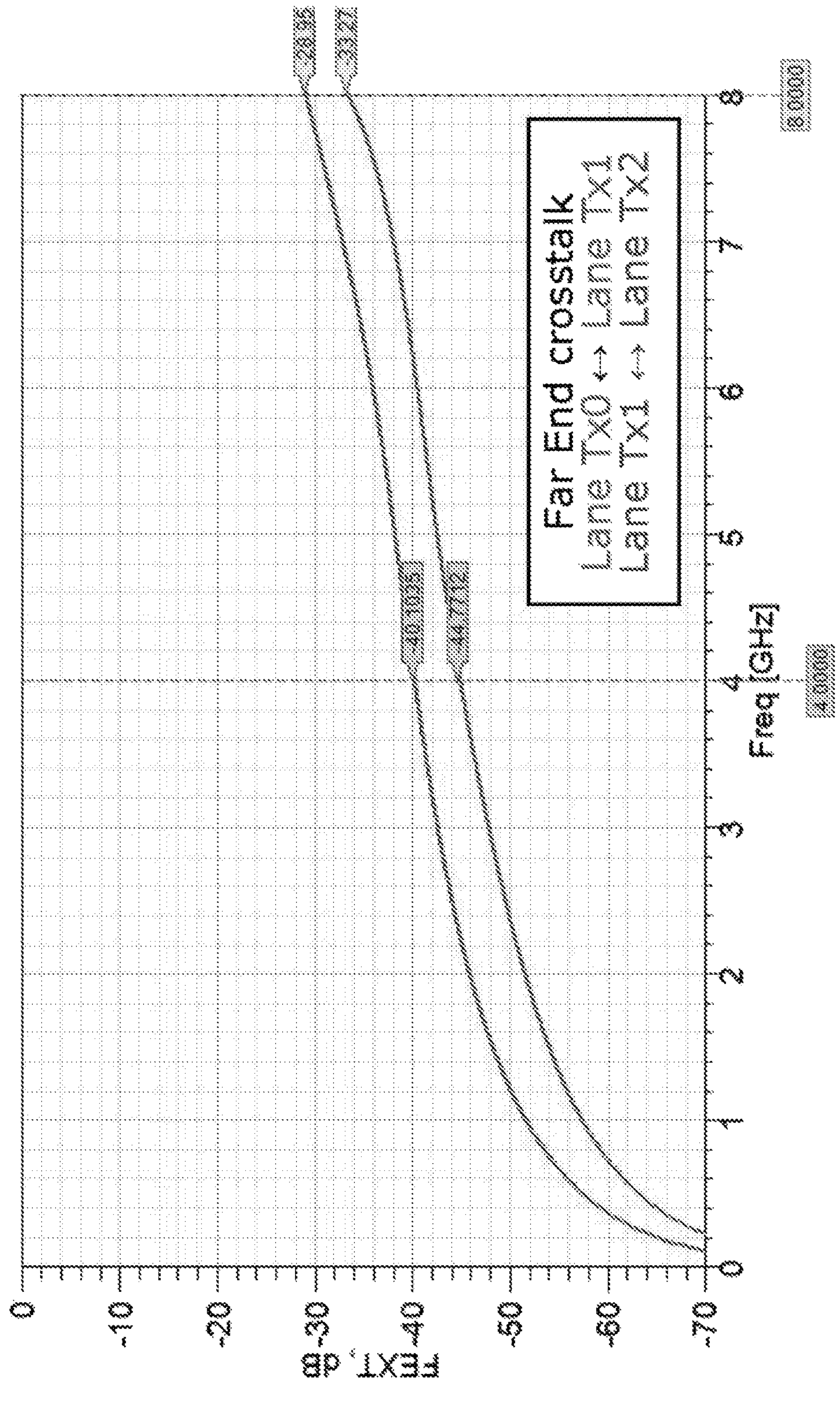
FIG. 7 illustrates a graph illustrating crosstalk characteristics between pins in an example connector.

Turning to FIG. 7, a graph is shown illustrating the difference in far-end crosstalk (FEXT) within the connector interface corresponding to the example of FIG. 6. For instance, in FIG. 7, the FEXT of adjacent lane pairs Tx0 (e.g., 615*a-b*) and Tx1 (e.g., 620*a-b*) is compared to the FEXT of pairs Tx1 (e.g., 620*a-b*) and Tx2 (e.g., 625*a-b*). The crosstalk difference is almost entirely due to differences in the signal:ground pin pattern. As shown, higher FEXT in the 4-8 GHz range can be particularly harmful at higher (e.g., PCIe Gen4) speeds. Further, channel analysis can also reflect the difference among lanes, including differences in the channel parameters eye width and eye height among other examples.

Figure 8:
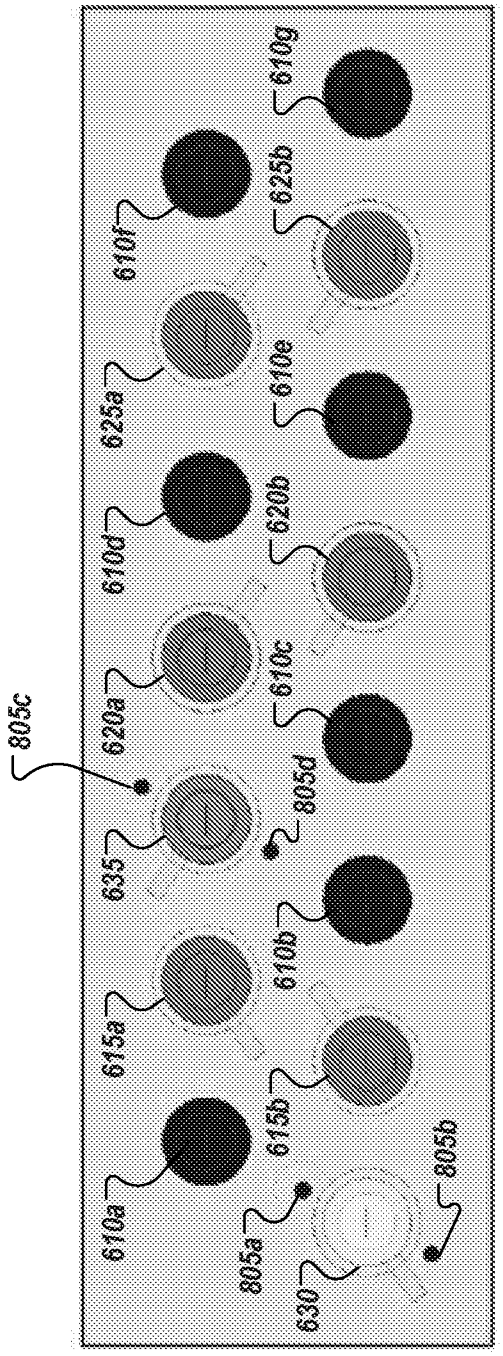
FIG. 8 illustrates a representation of an improved pin field of an example connector including one or more sideband conductors and one or more ground vias.

FIG. 8 shows an improved implementation of the portion of the pin field represented in the example of FIG. 6. The crosstalk manifest in the example of FIG. 6 can be attributed to the presence of sideband pins 630, 635 displacing ground returns for the differential pairs 615*a-b*, 620*a-b*. This ground return insufficiency in differential pairs adjacent to sideband signals can be addressed by providing the addition of small ground vias (e.g., 805*a-d*), referred to herein as "sentry vias", adjacent to each sideband via 630, 635. In this example, two sentry vias are provided for each sideband pin, although a single sentry via, or more than two sentry vias, can be provided per sideband via in other implementations. Each sentry via passes through the board to connect to both the top and bottom ground planes of the circuitry board and effectively stands in for the displaced ground pin. The sentry vias can provide ground returns positioned near the sideband pin and thereby approximate the more ideal ground return pattern around the signal pins as they transit the thickness of the baseboard.

In one example, the baseboard (x,y) via locations for the pins in the PCIe thru-hole and press-fit connectors can be dictated by the PCIe Card Electromechanical specification (CEM spec). Similarly, the electrical function assigned to each pin can also be dictated by the CEM spec. Compliance with this or another specification can force adoption of a particular pin field layout leaving no option for reassigning the pins to arrange the grounds differently, or to move the pin locations. In general, while the 4-ground Ground-Ground-Signal-Signal-Ground-Ground pattern provides adequate ground return paths for each differential pair, however, the addition of sentry vias proximate to non-ground pins (as shown in the example of FIG. 8) can approximate the ideal 4-ground pattern in some implementations.

As introduced above, a number (typically 2, 3, or 4) small ground vias (sentry vias) can be added adjacent to each sideband pin in the PCIe connector pin field. These small ground vias can provide a ground return path roughly equivalent to that of a large, CEM spec compliant, 27 mil ground via at the same pin position, and will not interfere with the assigned function of the sideband connector pin. In FIG. 8 above, two small 8 mil vias are located near each of the much larger sideband vias. In some implementations, the orientation of the sentry vias (relative to the perimeter of the sideband pin) are selected so as not to interfere with routing through the pin field, or violate PCB manufacturing rules. Further, positioning the sentry ground vias "adjacent" or "proximate" to the sideband pin can involve positioning the vias as close as is allowed to the corresponding sideband pin. For instance, a minimum offset distance can be defined for positioning additional vias next to a sideband (or other pin). Accordingly, corresponding sentry vias can be positioned as close to the border of this minimum (e.g., spec-defined) offset as is allowed.

Figure 9:
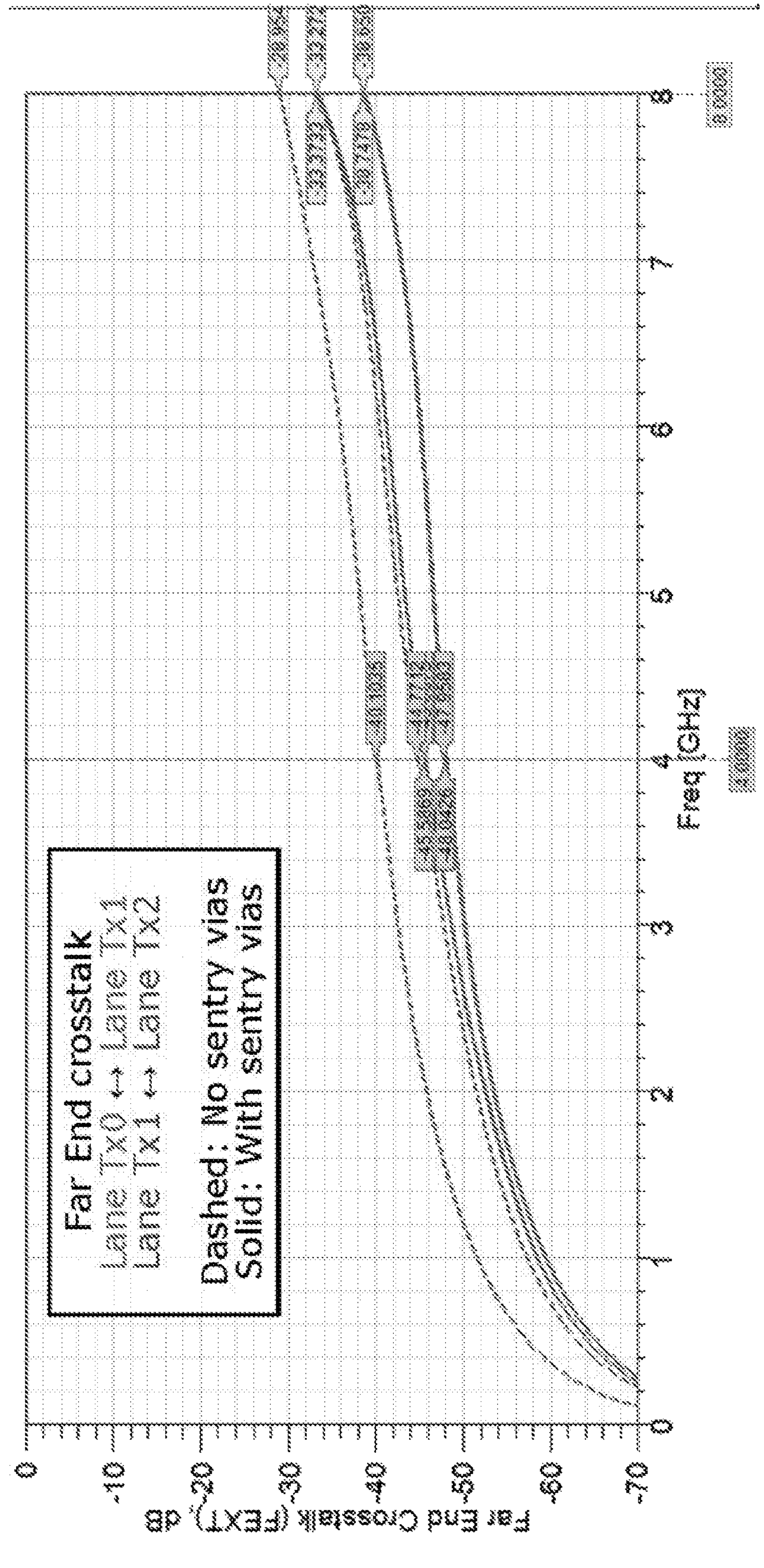
FIG. 9 illustrates a graph illustrating differences between crosstalk characteristics between pins in a particular example connector and an improved version of the particular connector.

FIG. 9 shows another graph showing the comparison of FIG. 7 (in dashed lines) overlaid with curves resulting from the addition of sentry vias according to the example of FIG. 8. Specifically, the graph of FIG. 9 shows the improvement possible for an example connector interface (e.g., of FIG. 6), when sentry vias are implemented (such as in FIG. 8). Here, approximately 6-10 dB of improvement is shown to be achieved with the addition of the sentry vias 805*a-d* (as shown in the example of FIG. 8). The improvement is sufficient to move FEXT for the worst case lane entirely below the FEXT of the baseline best case lane, as shown in FIG. 9.

Sentry vias can also help reduce a separate crosstalk mechanism, which stems from a resonant crosstalk peak in the sideband conductors, which falls at about 5 GHz. The sideband resonant crosstalk can be suppressed using AC sideband termination to damp the resonance, such as described in Provisional Patent Application Ser. No. 62/184,830, filed Jun. 25, 2015, and entitled "Sideband Conductor Resonance Mitigation" incorporated by reference in its entirety. However, sentry vias can partially abate the effects of sideband resonance. When combined, AC sideband termination and sentry vias can deliver better performance than either solution in isolation.

Figure 10:
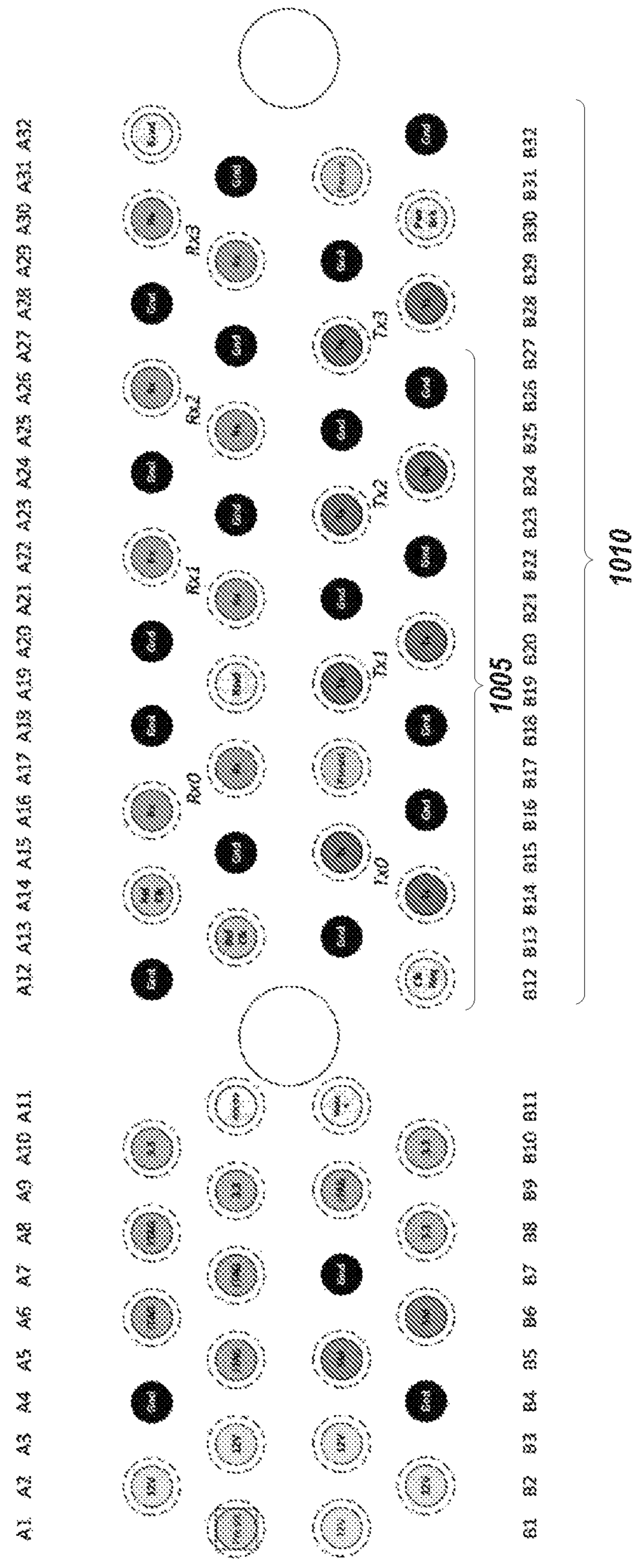
FIG. 10 illustrates a representation of a pin field of an example connector including one or more sideband conductors.

FIG. 10 illustrates a larger portion of an example PCIe connector pin field including a pin field portion (e.g., 1005) similar to the portion 605 illustrated in FIG. 6. In many pin positions in the high speed section of the PCIe connector, for instance, pins A12-A82 and pins B12-B82, sideband signals are found among the high speed differential pairs. For consistency, this discussion will refer to a particular high speed region (e.g., 1010) of the x4 connector pin field, A12-A32 and B12-B32, illustrated in FIG. 10. The x4 connector can have four Rx pairs and four Tx pairs. A 2:4 signal:ground ratio is present in the pin field for differential pairs Tx2, Tx3, and Rx2. This 2:4 pattern generally causes low pair-to-pair differential crosstalk, and good insertion loss performance. The remaining differential pairs have adjacent sideband signal pins, and fewer ground pins, with effective signal:ground ratios of 2:2 or 2:3.

The pin field, as in other examples, can additionally accommodate several sideband signals among the high speed section of the x4 connector, such as those shown in Table 1.

TABLE 1

Example Sideband Channels

| Pin | Function |
|---|---|
| A13 | Ref Clock+ |
| A14 | Ref Clock− |
| A19 | Reserved |
| A32 | Reserved |
| B12 | Clock Request# |
| B17 | Present2# |
| B30 | Power Break |
| B31 | Present2# |

Figure 11:
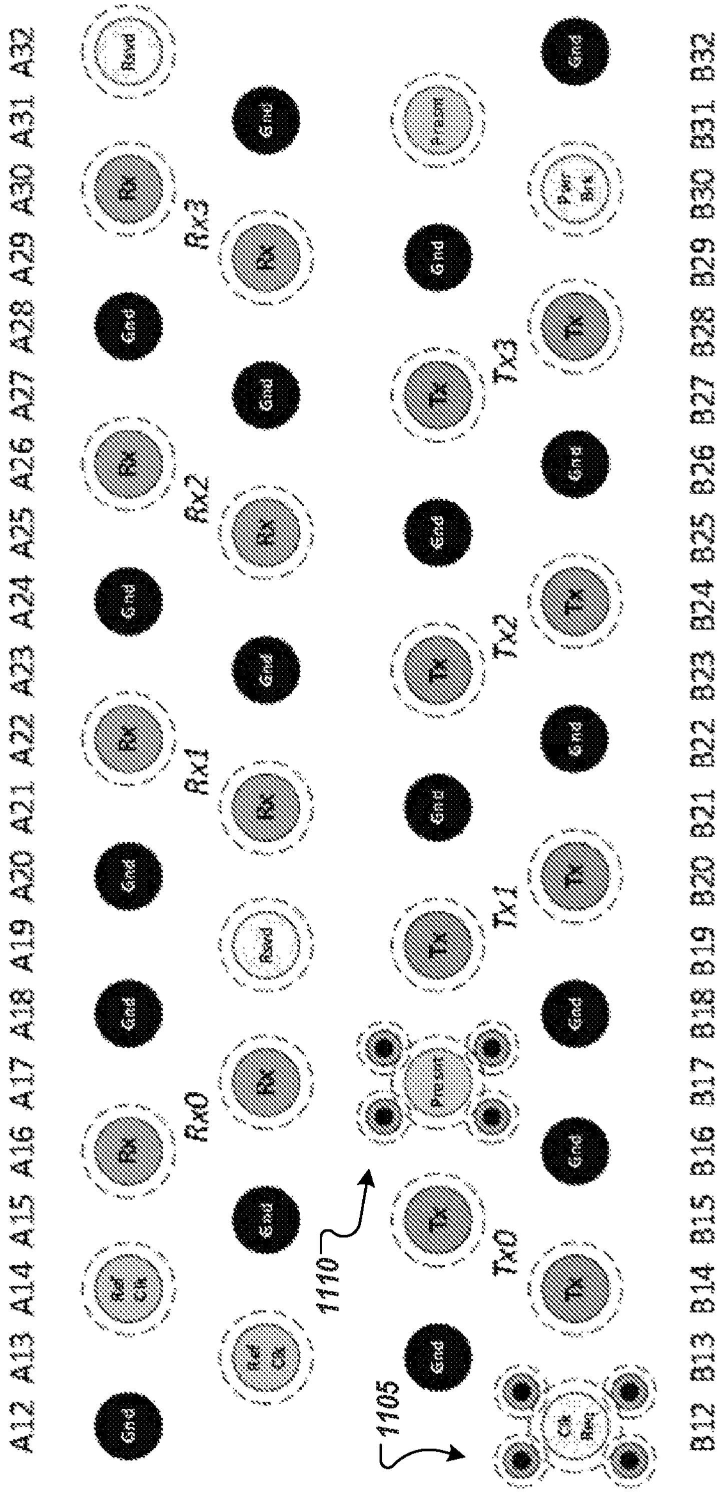
FIG. 11 illustrates a representation of an improved pin field of an example connector including one or more sideband conductors and one or more ground vias.

The concept introduced in the example of FIG. 8 can be applied across a larger pin field, such as that illustrated in FIG. 10. For instance, FIG. 11 shows am implementation of pin field region 1010 including at least one sideband pin provided with a corresponding set of small sentry vias (at 1105, 1110). In this case, a set of four sentry vias is provided (at 1105, 1110). As shown in FIG. 10, even applying small ground vias adjacent to only two of the sideband pins (at positions B12 and B17), similar to the scenario of FIG. 8, can produce marked crosstalk reduction by approximating the presence of a ground pin at each of these sideband pins (e.g., B12 and B17). In the example of FIG. 11, four ground vias are provided at each of the sideband pins. Providing greater numbers of ground vias can cause the sideband pins to appear more and more like ground pins (given the additional ground returns provided by the sentry ground vias). In some cases, however, providing additional sentry ground vias (e.g., above 4-6 per sideband pin) can provide diminishing returns and potential compromise the structural integrity of the board or impede lateral routing of signals through the pin field.

In some implementations, the coupling that causes the majority of the crosstalk is largely confined to the baseboard. In such cases, the magnitude of the crosstalk is linked to the thickness of the baseboard. Accordingly, the number of ground vias employed can be based on the thickness of the circuit baseboard. For instance, thinner baseboards may require only two sentry vias to reduce crosstalk to −35 dB at 8 GHz, for example, while a 120 mil board would use four sentry vias to suppress crosstalk to the same level.

Figure 12:
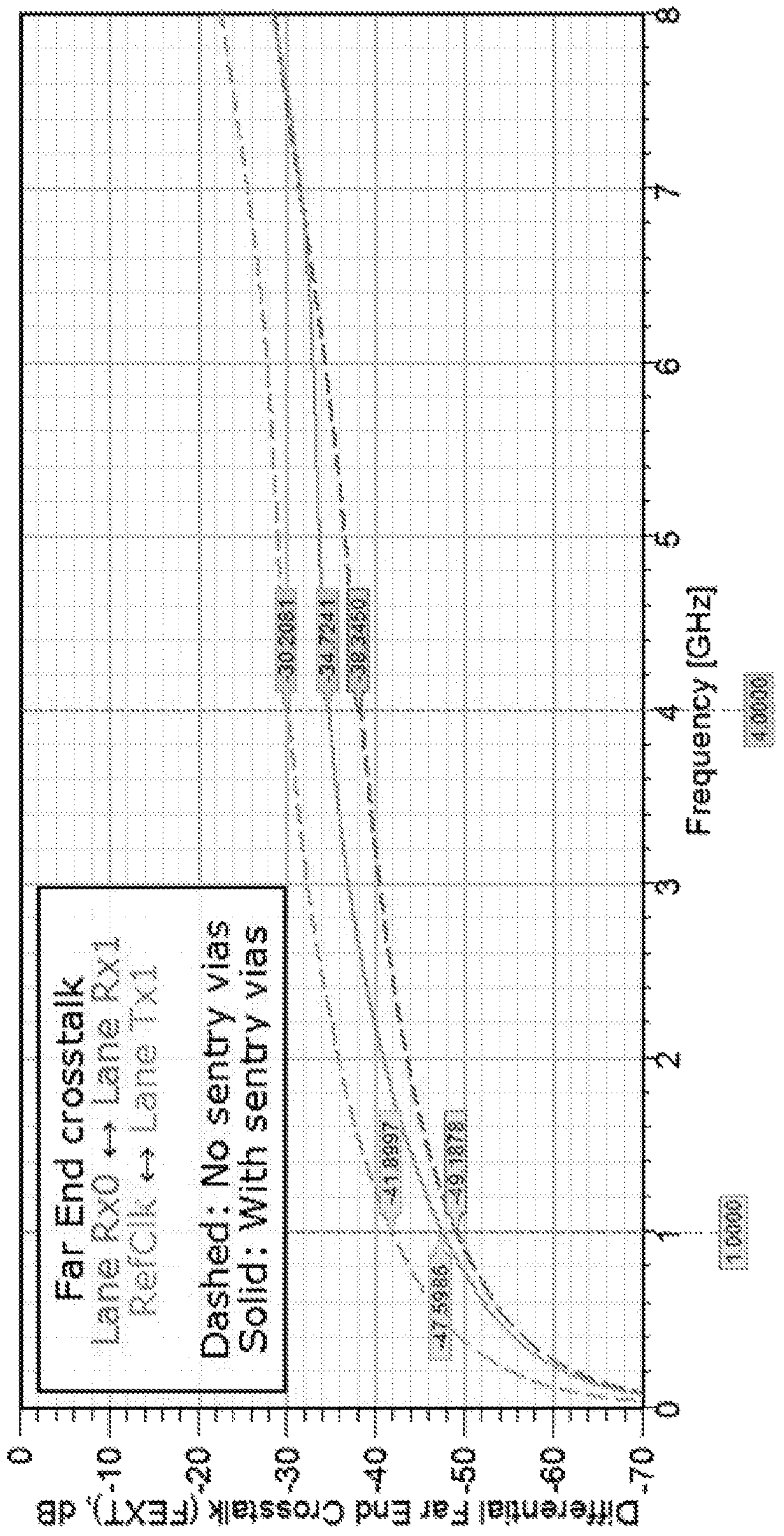
FIG. 12 illustrates a graph illustrating differences between crosstalk characteristics between pins in a particular example connector and an improved version of the particular connector.

A similar approach can be used to shield the 100 MHz baseband reference clock (RefClk) signals from the adjacent Rx0 pin pair. While the frequency content of the RefClk is generally lower than full-speed Gen4 traffic, the crosstalk between the RefClk pair (A13, A14) and Rx0 (A15, A16) may be markedly higher than any other adjacent pairs in the connector. While the addition of sentry vias for the RefClk pins can substantially reduce this crosstalk, it may not even reach the level of the baseline case for some lanes (e.g., Lane Rx0↔Lane Rx1). For instance, while the fundamental 100 MHz frequency of the RefClock falls at a frequency where its crosstalk might be discounted, the risetime should also be considered. If the risetime of the RefClk transition is sufficiently fast, it is possible that it could introduce glitches in the Rx0 Lane. Therefore, it may be prudent to add sentry vias to RefClk, to obtain 4-6 dB of incremental crosstalk reduction. Further, the RefClk pair may benefit from greater immunity to Rx0 traffic. For instance, FIG. 12 is a graph showing a comparison of baseline improved differential crosstalk between RefClk and Rx0, compared to baseline crosstalk Rx0 and Rx1.

Figure 13:
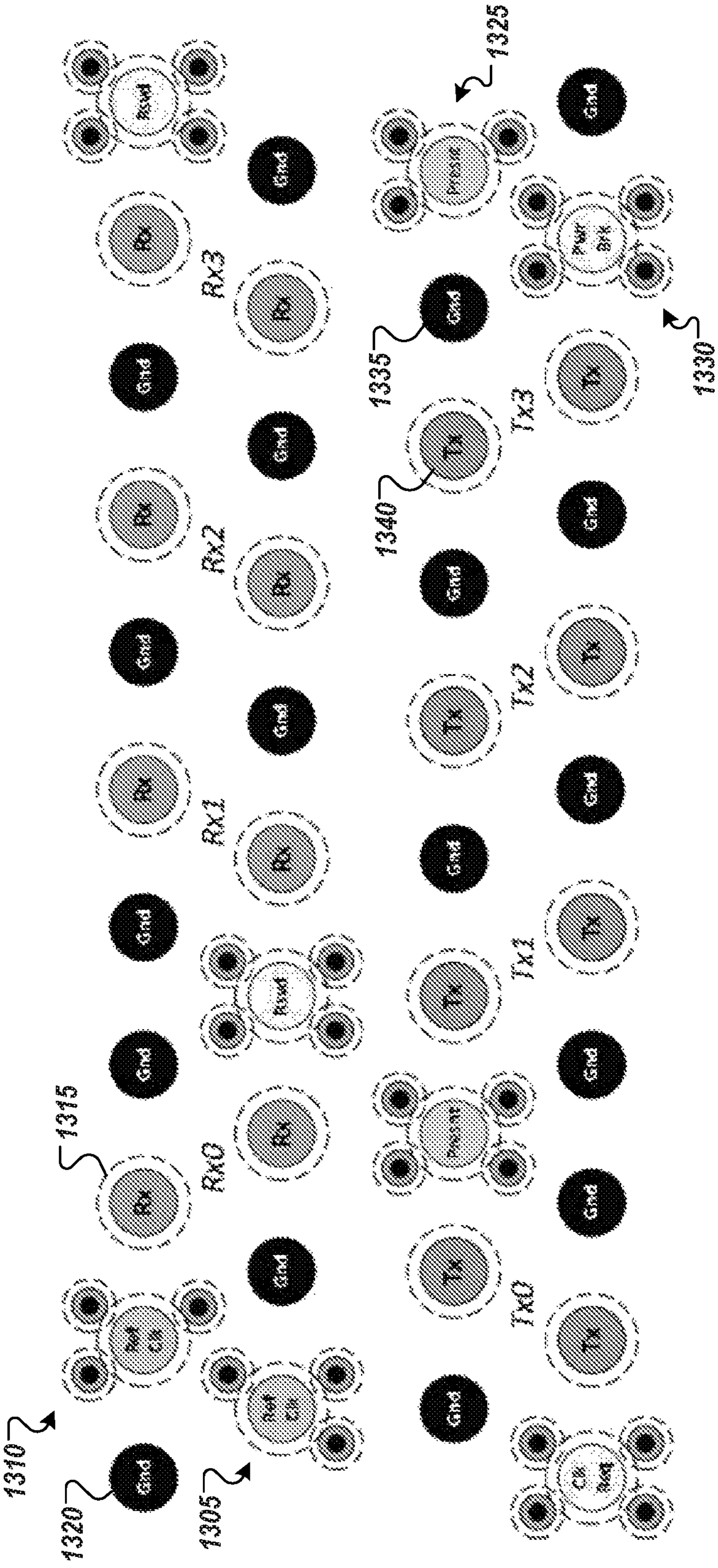
FIG. 13 illustrates a representation of another example of an improved pin field of an example connector including one or more sideband conductors and one or more ground vias.

The principles above can be applied across a connector pin field so as to add one or more ground vias proximate or adjacent to each sideband pin in the pin field, such as shown in the example of FIG. 13. In this example, each sideband pin (and each reference clock pin) is provided with at least three sentry vias. In some instances, such as the example of FIG. 13, fewer sentry vias may be used for some sideband (or reference clock) pins than others, based on their position within the field. For instance, reference clock pins 1305, 1310 are each provided with three via positioned to the right of the pin 1305, 1310 such that they are nearer to the neighboring differential signaling pins (e.g., 1315). The fourth sentry via can be omitted from pins 1305, 1310 given that the only pins to the left of the pins is a ground pin 1320 before the edge of the pin field is reached, diminishing the utility of adding the fourth sentry via to the pins 1305, 1310. In other instances, a sentry via can be omitted from a given sideband pin (e.g., at 1325) given the presence of sentry ground vias of other pins (e.g., at 1330) falling generally within proximity of the pin (e.g., 1325) as well as the presence of a ground pin (e.g., 1335) further insulating neighboring differential data pins (e.g., 1340) from the sideband pin (e.g., 1325), among other example considerations.

As shown in the examples of FIGS. 8, 11, and 13, multiple sentry vias can be positioned around the perimeter of a single sideband pin. The position of the sentry vias, relative to each other, can be selected to provide the most even distribution of additional ground return benefits. For instance, sentry vias of a single can be positioned in a symmetric orientation, to balance the corresponding ground return effects. In some cases, the geometry and layout of the board, as well as the presence of other nearby sideband pins with sentry vias can constrain how pins are laid out. Further, sentry vias can be positioned around a sideband pin so as to minimize the potential for these additional vias interfering with conductive channels within the board, among other examples. Other implementations may utilize alternative configurations. For instance, asymmetrical sentry via configurations can be adopted. Indeed, in some implementations, sentry vias of different diameters (e.g., rather than similar diameters, as in the examples illustrated herein) can be applied to sideband pins of a pin field, including two different sized sentry vias around the same sideband pin, to maximize the effectiveness of the sentry vias, among other example alternatives and considerations.

Figure 14:
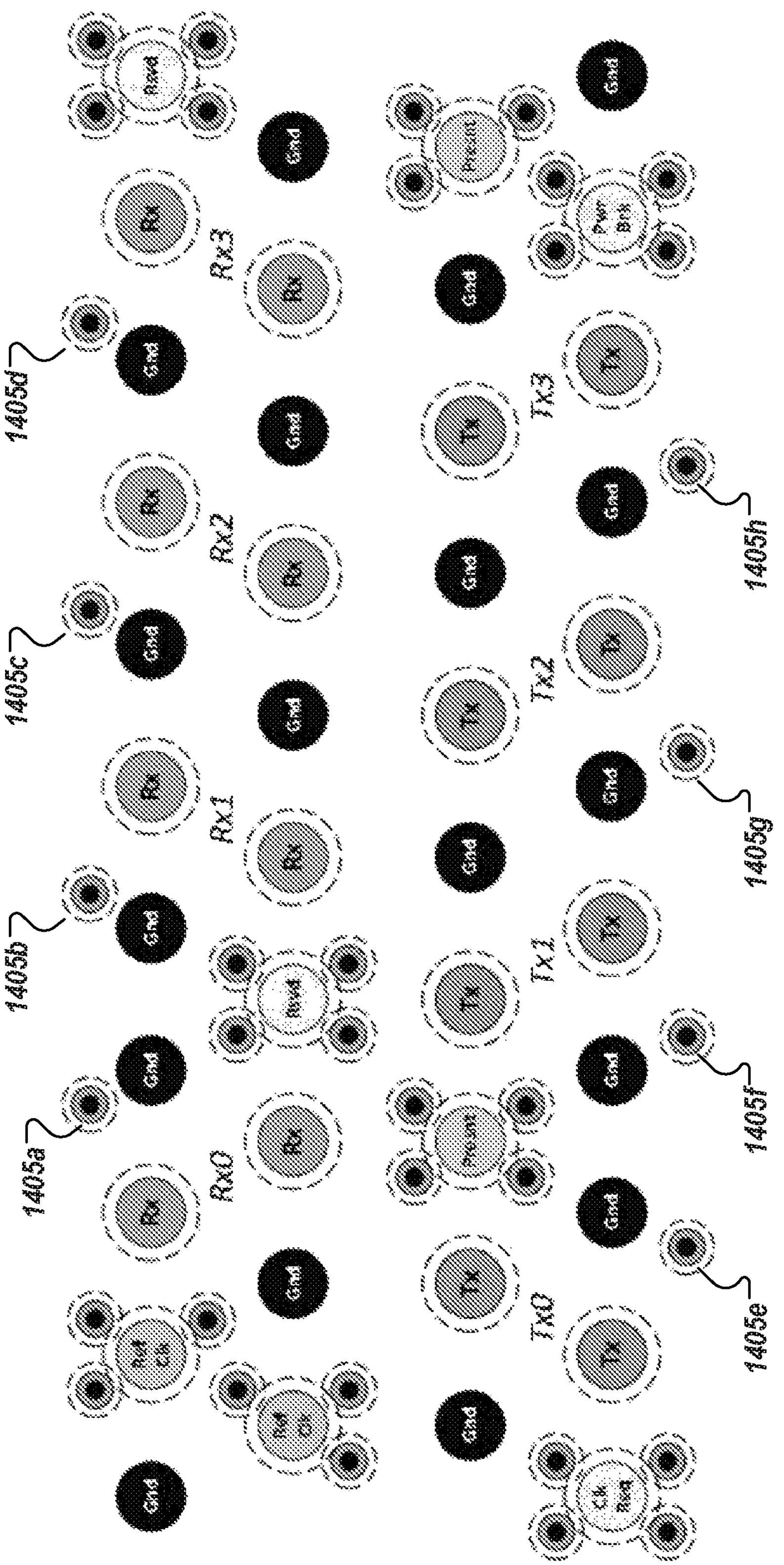
FIG. 14 illustrates a representation of another example of an improved pin field of an example connector including one or more sideband conductors and one or more ground vias.
Figure 15:
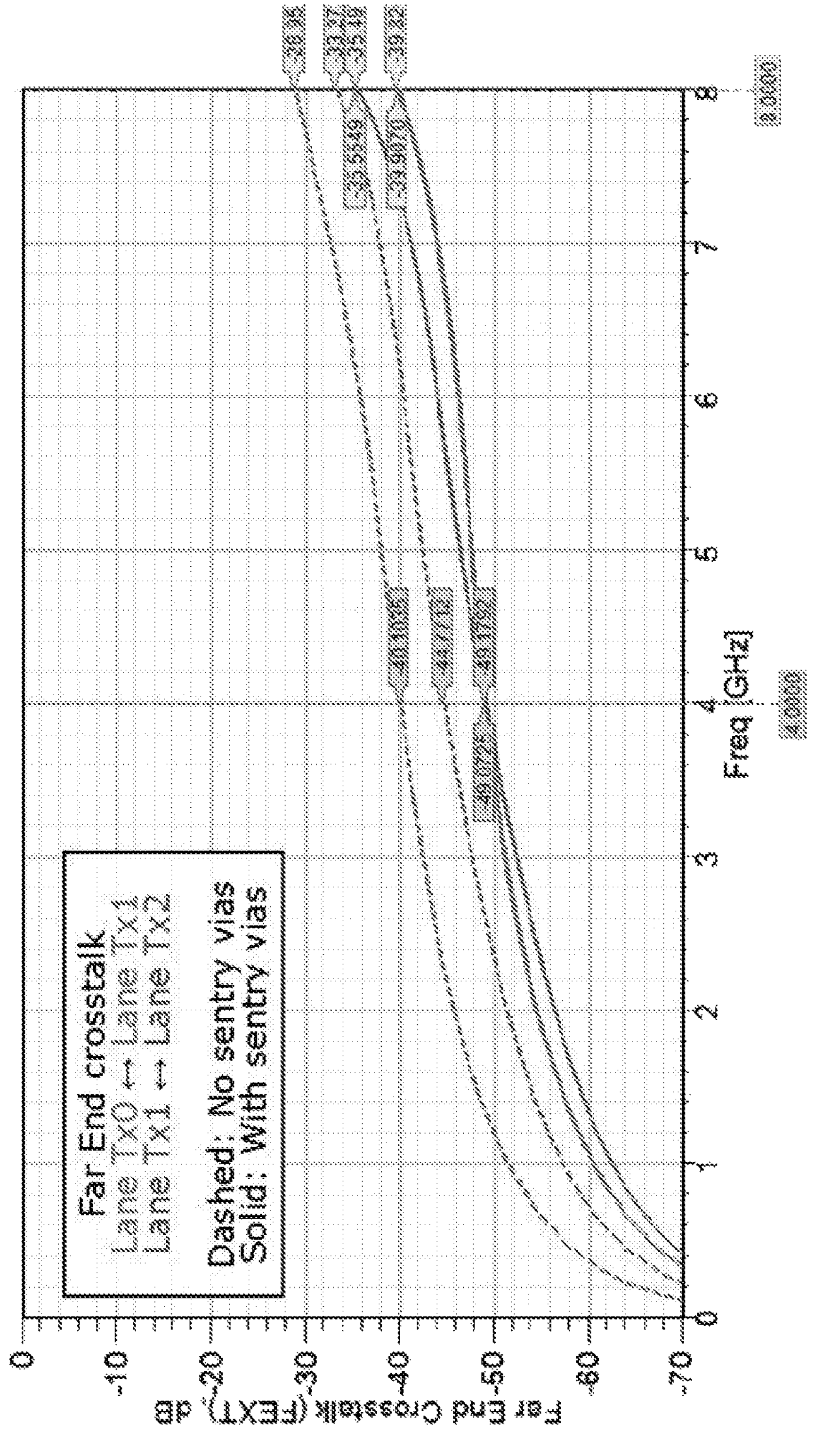
FIG. 15 illustrates a graph illustrating differences between crosstalk characteristics between pins in a particular example connector and an improved version of the particular connector

In some implementations, even when providing each sideband pin with corresponding ground vias, some energy can "leak" around edges of the pin field and introduce crosstalk. For instance, as shown in FIG. 14, the pin field shown in FIG. 13 is enhanced through the introduction of additional ground vias (e.g., 1405*a-h*) at the top and bottom borders of the pin field. For instance, for differential pins at the edges, or border, of the pin field (e.g., pins A16, A22, A26, A30, B14, B20, B24, B28) some energy can travel outside the pin field border (e.g., and around a neighboring ground pin or ground vias) and introduce cross talk from the nearest differential pin pair. Accordingly, in the example of FIG. 14, ground pins at the border of the pin field (e.g., ground pins A12, A18, A20, A24, A28, B16, B18, B22, B26, B32) can be provided with "outrigger" sentry ground vias (e.g., 1405*a-h*) that extend outside the pin field border to act as a ground return capturing energy that end-runs the ground pins and ground vias at the pin field border. FIG. 15 shows a graph illustrating the improvement to differential FEXT with the provision of outrigger sentry vias (shown in FIG. 14) added to the sideband sentry vias. As shown, the benefits can be particularly noteworthy at higher frequencies (e.g., in the 8 GHz range).

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 16:
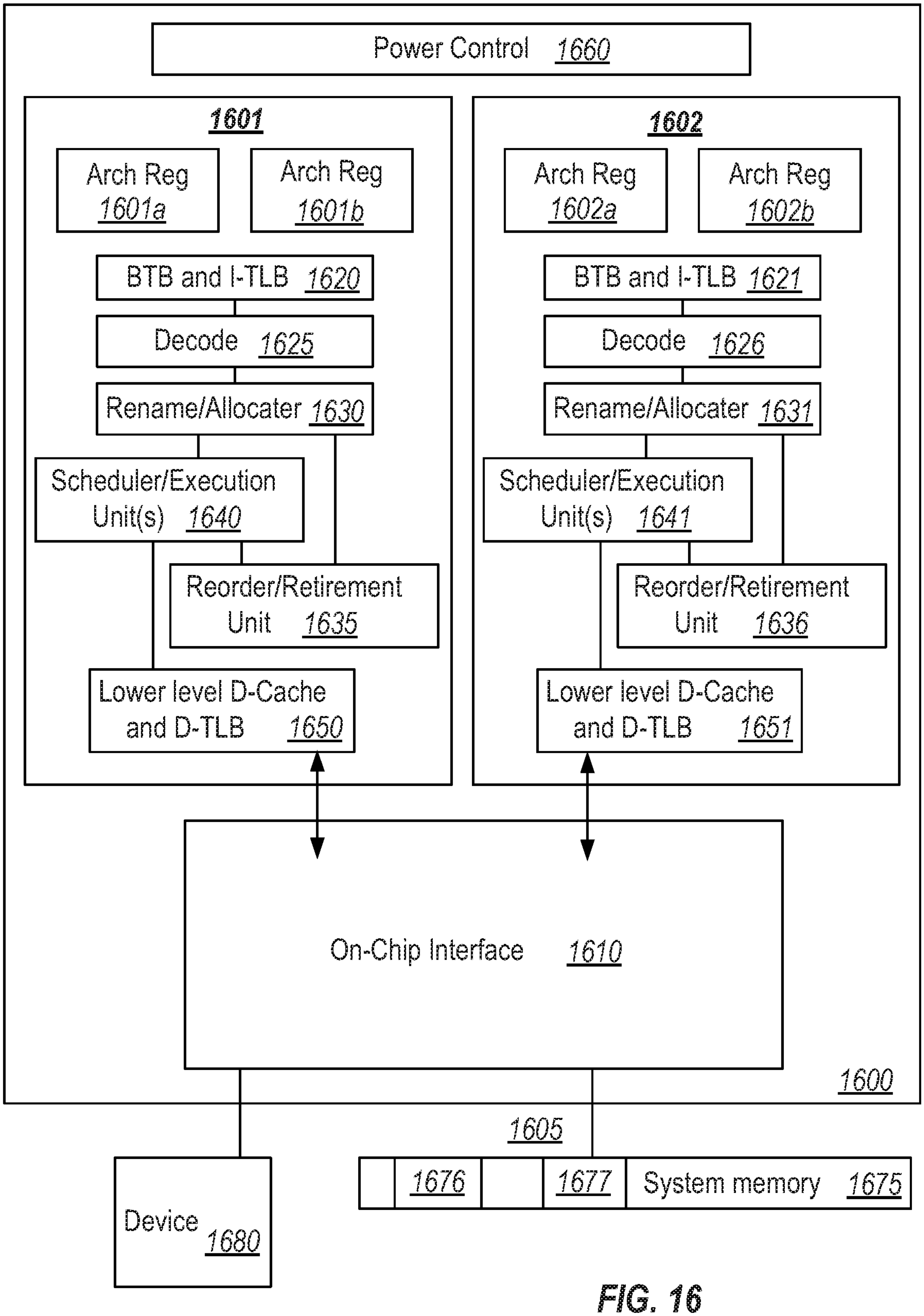
FIG. 16 illustrates an embodiment of a block diagram for a computing system including a multicore processor.

Referring to FIG. 16, an embodiment of a block diagram for a computing system including a multicore processor is depicted. Processor 1600 includes any processor or processing device, such as a microprocessor, an embedded processor, a digital signal processor (DSP), a network processor, a handheld processor, an application processor, a co-processor, a system on a chip (SOC), or other device to execute code. Processor 1600, in one embodiment, includes at least two cores—core 1601 and 1602, which may include asymmetric cores or symmetric cores (the illustrated embodiment). However, processor 1600 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1600, as illustrated in FIG. 16, includes two cores—core 1601 and 1602. Here, core 1601 and 1602 are considered symmetric cores, i.e. cores with the same configurations, functional units, and/or logic. In another embodiment, core 1601 includes an out-of-order processor core, while core 1602 includes an in-order processor core. However, cores 1601 and 1602 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1601 are described in further detail below, as the units in core 1602 operate in a similar manner in the depicted embodiment.

As depicted, core 1601 includes two hardware threads 1601*a* and 1601*b*, which may also be referred to as hardware thread slots 1601*a* and 1601*b*. Therefore, software entities, such as an operating system, in one embodiment potentially view processor 1600 as four separate processors, i.e., four logical processors or processing elements capable of executing four software threads concurrently. As alluded to above, a first thread is associated with architecture state registers 1601*a*, a second thread is associated with architecture state registers 1601*b*, a third thread may be associated with architecture state registers 1602*a*, and a fourth thread may be associated with architecture state registers 1602*b*. Here, each of the architecture state registers (1601*a*, 1601*b*, 1602*a*, and 1602*b*) may be referred to as processing elements, thread slots, or thread units, as described above. As illustrated, architecture state registers 1601*a* are replicated in architecture state registers 1601*b*, so individual architecture states/contexts are capable of being stored for logical processor 1601*a* and logical processor 1601*b*. In core 1601, other smaller resources, such as instruction pointers and renaming logic in allocator and renamer block 1630 may also be replicated for threads 1601*a* and 1601*b*. Some resources, such as re-order buffers in reorder/retirement unit 1635, ILTB 1620, load/store buffers, and queues may be shared through partitioning. Other resources, such as general purpose internal registers, page-table base register(s), low-level data-cache and data-TLB 1615, execution unit(s) 1640, and portions of out-of-order unit 1635 are potentially fully shared.

Processor 1600 often includes other resources, which may be fully shared, shared through partitioning, or dedicated by/to processing elements. In FIG. 16, an embodiment of a purely exemplary processor with illustrative logical units/resources of a processor is illustrated. Note that a processor may include, or omit, any of these functional units, as well as include any other known functional units, logic, or firmware not depicted. As illustrated, core 1601 includes a simplified, representative out-of-order (OOO) processor core. But an in-order processor may be utilized in different embodiments. The OOO core includes a branch target buffer 1620 to predict branches to be executed/taken and an instruction-translation buffer (I-TLB) 1620 to store address translation entries for instructions.

Core 1601 further includes decode module 1625 coupled to fetch unit 1620 to decode fetched elements. Fetch logic, in one embodiment, includes individual sequencers associated with thread slots 1601*a*, 1601*b*, respectively. Usually core 1601 is associated with a first ISA, which defines/specifies instructions executable on processor 1600. Often machine code instructions that are part of the first ISA include a portion of the instruction (referred to as an opcode), which references/specifies an instruction or operation to be performed. Decode logic 1625 includes circuitry that recognizes these instructions from their opcodes and passes the decoded instructions on in the pipeline for processing as defined by the first ISA. For example, as discussed in more detail below decoders 1625, in one embodiment, include logic designed or adapted to recognize specific instructions, such as transactional instruction. As a result of the recognition by decoders 1625, the architecture or core 1601 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1626, in one embodiment, recognize the same ISA (or a subset thereof). Alternatively, in a heterogeneous core environment, decoders 1626 recognize a second ISA (either a subset of the first ISA or a distinct ISA).

In one example, allocator and renamer block 1630 includes an allocator to reserve resources, such as register files to store instruction processing results. However, threads 1601*a* and 1601*b* are potentially capable of out-of-order execution, where allocator and renamer block 1630 also reserves other resources, such as reorder buffers to track instruction results. Unit 1630 may also include a register renamer to rename program/instruction reference registers to other registers internal to processor 1600. Reorder/retirement unit 1635 includes components, such as the reorder buffers mentioned above, load buffers, and store buffers, to support out-of-order execution and later in-order retirement of instructions executed out-of-order.

Scheduler and execution unit(s) block 1640, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1650 are coupled to execution unit(s) 1640. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1601 and 1602 share access to higher-level or further-out cache, such as a second level cache associated with on-chip interface 1610. Note that higher-level or further-out refers to cache levels increasing or getting further way from the execution unit(s). In one embodiment, higher-level cache is a last-level data cache—last cache in the memory hierarchy on processor 1600—such as a second or third level data cache. However, higher level cache is not so limited, as it may be associated with or include an instruction cache. A trace cache—a type of instruction cache—instead may be coupled after decoder 1625 to store recently decoded traces. Here, an instruction potentially refers to a macro-instruction (i.e. a general instruction recognized by the decoders), which may decode into a number of micro-instructions (micro-operations).

In the depicted configuration, processor 1600 also includes on-chip interface module 1610. Historically, a memory controller, which is described in more detail below, has been included in a computing system external to processor 1600. In this scenario, on-chip interface 1610 is to communicate with devices external to processor 1600, such as system memory 1675, a chipset (often including a memory controller hub to connect to memory 1675 and an I/O controller hub to connect peripheral devices), a memory controller hub, a northbridge, or other integrated circuit. And in this scenario, bus 1605 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1675 may be dedicated to processor 1600 or shared with other devices in a system. Common examples of types of memory 1675 include DRAM, SRAM, non-volatile memory (NV memory), and other known storage devices. Note that device 1680 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1600. For example in one embodiment, a memory controller hub is on the same package and/or die with processor 1600. Here, a portion of the core (an on-core portion) 1610 includes one or more controller(s) for interfacing with other devices such as memory 1675 or a graphics device 1680. The configuration including an interconnect and controllers for interfacing with such devices is often referred to as an on-core (or un-core configuration). As an example, on-chip interface 1610 includes a ring interconnect for on-chip communication and a high-speed serial point-to-point link 1605 for off-chip communication. Yet, in the SOC environment, even more devices, such as the network interface, co-processors, memory 1675, graphics processor 1680, and any other known computer devices/interface may be integrated on a single die or integrated circuit to provide small form factor with high functionality and low power consumption.

In one embodiment, processor 1600 is capable of executing a compiler, optimization, and/or translator code 1677 to compile, translate, and/or optimize application code 1676 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 17:
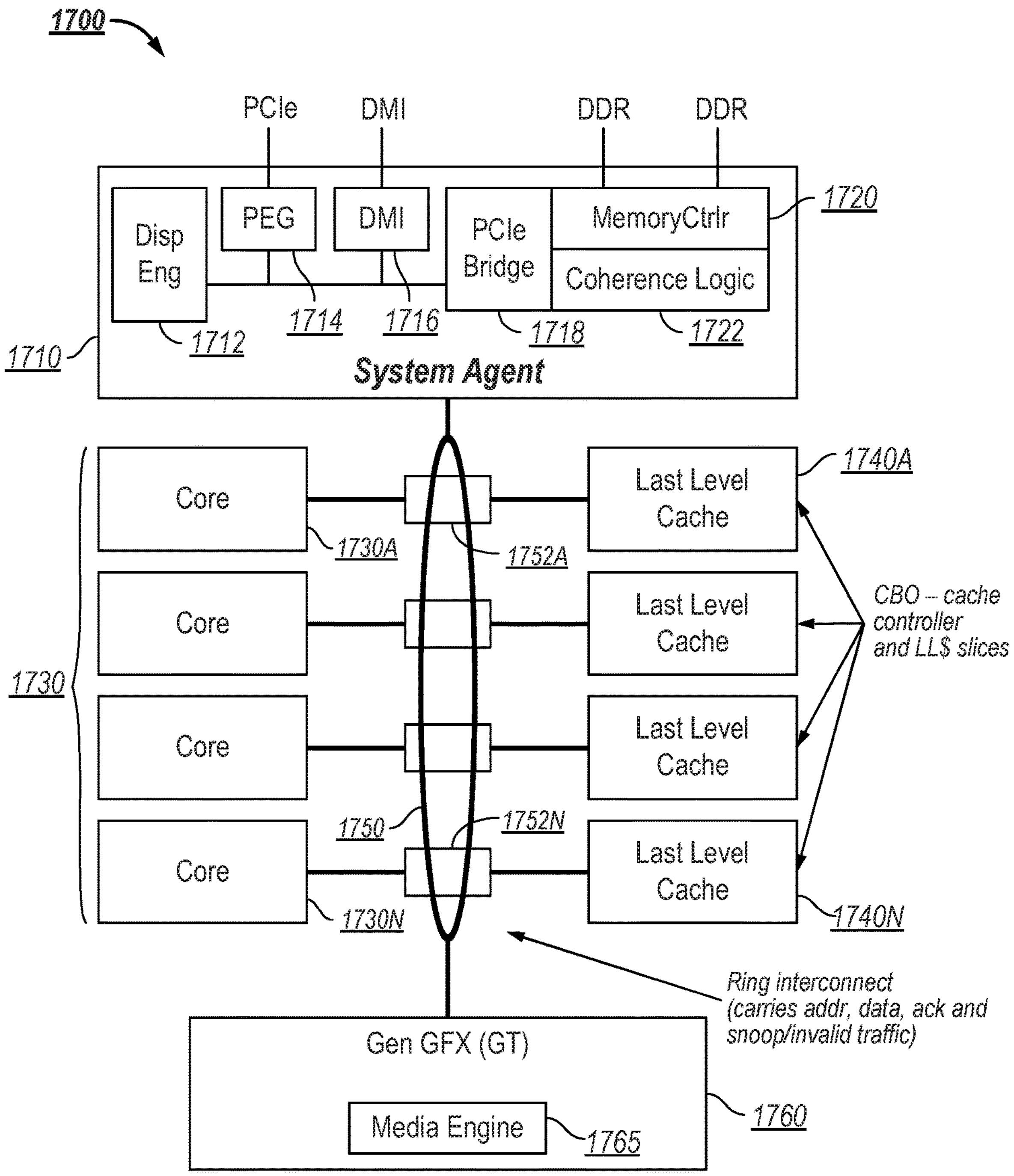
FIG. 17 illustrates an embodiment of a block diagram for a processor.

Referring now to FIG. 17, shown is a block diagram of an embodiment of a multicore processor. As shown in the embodiment of FIG. 17, processor 1700 includes multiple domains. Specifically, a core domain 1730 includes a plurality of cores 1730A-1730N, a graphics domain 1760 includes one or more graphics engines having a media engine 1765, and a system agent domain 1710.

In various embodiments, system agent domain 1710 handles power control events and power management, such that individual units of domains 1730 and 1760 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 1730 and 1760 may operate at different voltage and/or power, and furthermore the individual units within the domains each potentially operate at an independent frequency and voltage. Note that while only shown with three domains, understand the scope of the present invention is not limited in this regard and additional domains may be present in other embodiments.

As shown, each core 1730 further includes low level caches in addition to various execution units and additional processing elements. Here, the various cores are coupled to each other and to a shared cache memory that is formed of a plurality of units or slices of a last level cache (LLC) 1740A-1740N; these LLCs often include storage and cache controller functionality and are shared amongst the cores, as well as potentially among the graphics engine too.

As seen, a ring interconnect 1750 couples the cores together, and provides interconnection between the core domain 1730, graphics domain 1760 and system agent circuitry 1710, via a plurality of ring stops 1752A-1752N, each at a coupling between a core and LLC slice. As seen in FIG. 17, interconnect 1750 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, Intel On-chip System Fabric (IOSF), an Advanced Microcontroller Bus Architecture (AMBA) interconnect, a multi-dimensional mesh fabric, or other known interconnect architecture) may be utilized in a similar fashion.

As further depicted, system agent domain 1710 includes display engine 1712 which is to provide control of and an interface to an associated display. System agent domain 1710 may include other units, such as: an integrated memory controller 1720 that provides for an interface to a system memory (e.g., a DRAM implemented with multiple DIMMs; coherence logic 1722 to perform memory coherence operations. Multiple interfaces may be present to enable interconnection between the processor and other circuitry. For example, in one embodiment at least one direct media interface (DMI) 1716 interface is provided as well as one or more PCIe™ interfaces 1714. The display engine and these interfaces typically couple to memory via a PCIe™ bridge 1718. Still further, to provide for communications between other agents, such as additional processors or other circuitry, one or more other interfaces (e.g. an Intel® Quick Path Interconnect (QPI) fabric) may be provided.

Figure 18:
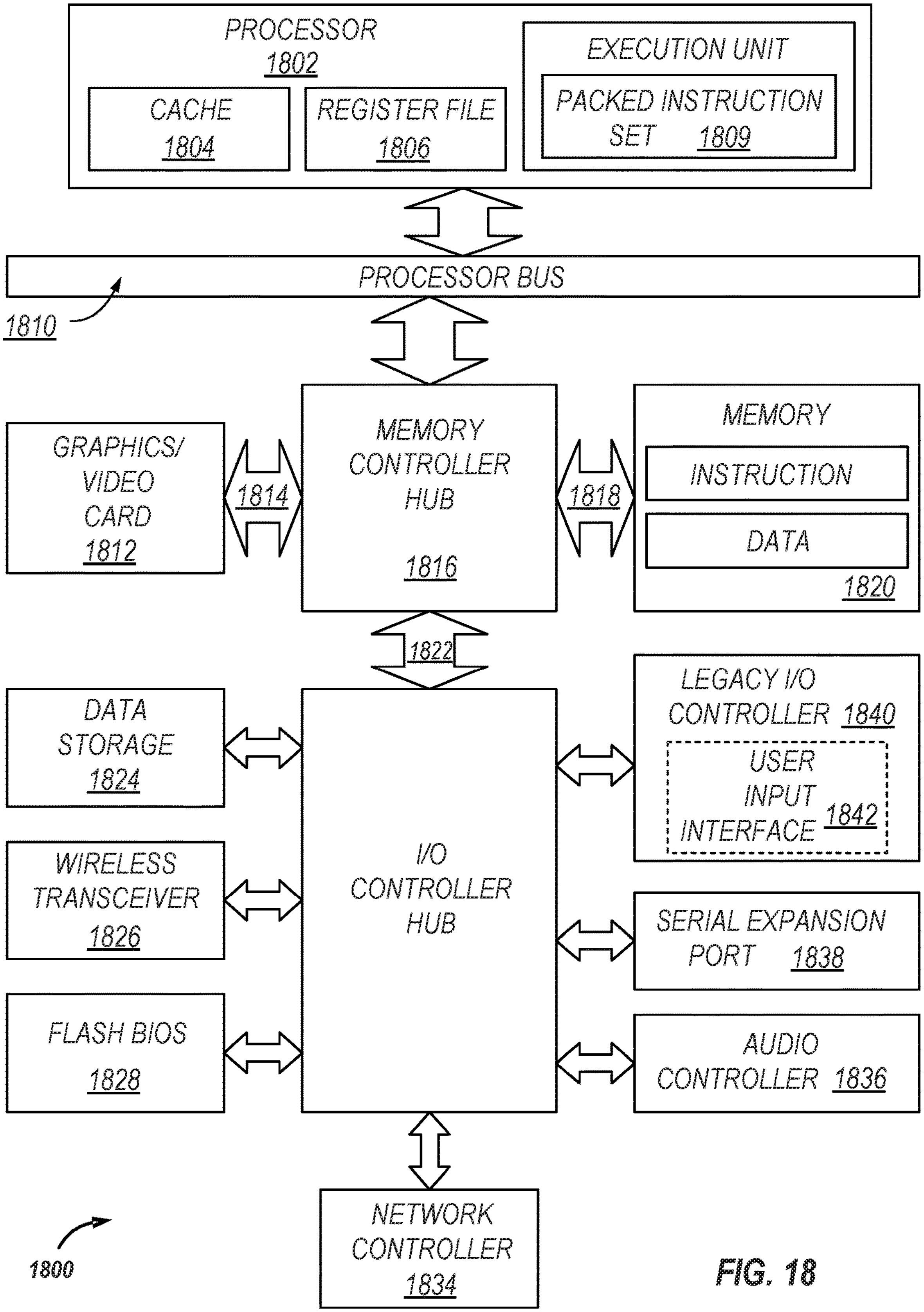
FIG. 18 illustrates an embodiment of a block for a computing system including multiple processor sockets.

Turning to FIG. 18, a block diagram of an exemplary computer system formed with a processor that includes execution units to execute an instruction, where one or more of the interconnects implement one or more features in accordance with one embodiment of the present invention is illustrated. System 1800 includes a component, such as a processor 1802 to employ execution units including logic to perform algorithms for process data, in accordance with the present invention, such as in the embodiment described herein. System 1800 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 1800 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1802 includes one or more execution units 1808 to implement an algorithm that is to perform at least one instruction. One embodiment may be described in the context of a single processor desktop or server system, but alternative embodiments may be included in a multiprocessor system. System 1800 is an example of a 'hub' system architecture. The computer system 1800 includes a processor 1802 to process data signals. The processor 1802, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1802 is coupled to a processor bus 1810 that transmits data signals between the processor 1802 and other components in the system 1800. The elements of system 1800 (e.g. graphics accelerator 1812, memory controller hub 1816, memory 1820, I/O controller hub 1824, wireless transceiver 1826, Flash BIOS 1828, Network controller 1834, Audio controller 1836, Serial expansion port 1838, I/O controller 1840, etc.) perform their conventional functions that are well known to those familiar with the art.

In one embodiment, the processor 1802 includes a Level 1 (L1) internal cache memory 1804. Depending on the architecture, the processor 1802 may have a single internal cache or multiple levels of internal caches. Other embodiments include a combination of both internal and external caches depending on the particular implementation and needs. Register file 1806 is to store different types of data in various registers including integer registers, floating point registers, vector registers, banked registers, shadow registers, checkpoint registers, status registers, and instruction pointer register.

Execution unit 1808, including logic to perform integer and floating point operations, also resides in the processor 1802. The processor 1802, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1802. For one embodiment, execution unit 1808 includes logic to handle a packed instruction set 1809. By including the packed instruction set 1809 in the instruction set of a general-purpose processor 1802, along with associated circuitry to execute the instructions, the operations used by many multimedia applications may be performed using packed data in a general-purpose processor 1802. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1808 may also be used in micro controllers, embedded processors, graphics devices, DSPs, and other types of logic circuits. System 1800 includes a memory 1820. Memory 1820 includes a dynamic random access memory (DRAM) device, a static random access memory (SRAM) device, flash memory device, or other memory device. Memory 1820 stores instructions and/or data represented by data signals that are to be executed by the processor 1802.

Note that any of the aforementioned features or aspects of the invention may be utilized on one or more interconnect illustrated in FIG. 18. For example, an on-die interconnect (ODI), which is not shown, for coupling internal units of processor 1802 implements one or more aspects of the invention described above. Or the invention is associated with a processor bus 1810 (e.g. Intel Quick Path Interconnect (QPI) or other known high performance computing interconnect), a high bandwidth memory path 1818 to memory 1820, a point-to-point link to graphics accelerator 1812 (e.g. a Peripheral Component Interconnect express (PCIe) compliant fabric), a controller hub interconnect 1822, an I/O or other interconnect (e.g. USB, PCI, PCIe) for coupling the other illustrated components. Some examples of such components include the audio controller 1836, firmware hub (flash BIOS) 1828, wireless transceiver 1826, data storage 1824, legacy I/O controller 1810 containing user input and keyboard interfaces 1842, a serial expansion port 1838 such as Universal Serial Bus (USB), and a network controller 1834. The data storage device 1824 can comprise a hard disk drive, a floppy disk drive, a CD-ROM device, a flash memory device, or other mass storage device.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide an apparatus, a system, a machine readable storage, a machine readable medium, and a method to provide a circuit board including a top ground plane, a bottom ground plane, a pin field of a connector with a plurality of pins including a plurality of differential pin pairs, one or more ground pins, and one or more sideband pins, where at least a particular one of the sideband pins is positioned within the pin field adjacent to a first pin of a first one of the differential pin pairs. One or more ground vias are provided on the circuit board positioned to correspond to the particular sideband pin.

In one example, the particular sideband pin is immediately between the first pin and a second pin of a second one of the differential pin pairs.

In one example, the ground via provides a ground return for energy emitted by one or both of the first and second pins during signaling on one or both of the first and second differential pin pairs.

In one example, the ground via mitigates crosstalk appearing on the sideband during signaling on either or both the first and second differential pin pairs.

In one example, the plurality of pins further includes a third pin and a fourth pin, and a particular one of the ground pins is positioned immediately between the third and fourth pins.

In one example, the third pin is included in a third differential pin pair.

In one example, the circuit board further includes one or more additional ground vias corresponding to the particular ground pin.

In one example, the third and fourth pins and ground pin are on an edge of the pin field and the ground via is positioned outside of the pin field.

In one example, the third pin is included in the first differential pair and the fourth pin is included in the second differential pair.

In one example, each ground via passes through the circuit board and is connected to both the top ground plane and to the bottom ground plane.

In one example, the ground via is placed a minimum allowed distance from the particular sideband pin.

In one example, the one or more ground vias include at least two ground vias.

In one example, the at least two ground vias are aligned parallel to the first differential pair.

In one example, the at least two ground vias are positioned to provide a path for routing of one or more conductive paths within the circuit board.

In one example, the one or more ground vias include at least three ground vias positioned around the perimeter of the particular sideband pin.

In one example, the pin field is laid out according to a PCIe-based specification.

In one example, the sideband pin includes a clock pin.

In one example, the first differential pin pair corresponds to a high speed differential channel and the sideband pin corresponds to a lower speed sideband channel.

One or more embodiments may provide an apparatus, a system that includes a baseboard including a top ground plane and a bottom ground plane, a connector, and a card device connected to the baseboard by the connector. The connector can include a pin field including a plurality of pins, where the plurality of pins includes a plurality of differential pin pairs, one or more ground pins, and one or more sideband pins. At least a particular one of the sideband pins is positioned within the pin field immediately between a first pin of a first one of the differential pin pairs and a second pin of a second one of the differential pin pairs, and one or more ground vias positioned to correspond to the particular sideband pin, where the one or more ground vias connect to both the top and bottom ground planes of the baseboard.

One or more embodiments may provide an apparatus, a system, a machine readable storage, a machine readable medium, and a method to provide a connector including a pin field including a plurality of pins, where the plurality of pins includes a plurality of differential pin pairs, one or more ground pins, and one or more sideband pins, where at least a particular one of the sideband pins is positioned within the pin field immediately between a first pin of a first one of the differential pin pairs and a second pin of a second one of the differential pin pairs. The connector can further include a top ground plane, a bottom ground plane, and one or more ground vias positioned within a distance of the particular sideband pin, where the one or more ground vias connect to both the top and bottom ground planes.

In one example, the distance corresponds to a minimum allowed distance from the particular sideband pin.

In one example, the ground vias mitigate against crosstalk appearing on the particular sideband pin during signaling on one or both of the first and second differential pin pairs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:

a system board comprising:

a pinfield, wherein the pinfield comprises:

a set of differential signal conductors to correspond to pins of a connector for a set of differential signaling pairs;

a set of ground conductors to correspond to pins of the connector for a set of grounds;

a set of sideband signal conductors to carry sideband signals; and a plurality of sentry ground vias adjacent to a particular one of the sideband signal conductors in the set of sideband signal conductors;

wherein the plurality of sentry ground vias have a diameter smaller than diameters of pins of the connector and smaller than diameters of vias of the sideband signal conductors.

2. The apparatus of claim 1, wherein the plurality of sentry ground vias comprises at least three sentry ground vias adjacent to a particular one of the sideband signal conductors in the set of sideband signal conductors.

3. The apparatus of claim 1, wherein the plurality of sentry ground vias comprises a plurality of thru-hole vias.

4. The apparatus of claim 1, further comprising a thru-hole connector joined to the pinfield.

5. The apparatus of claim 4, wherein the connector comprises one of an x1, x4, x8, or x16 width connector.

6. The apparatus of claim 1, wherein the set of sideband signal conductors comprises one or more of a conductor for a clock request (CLKREQ) signal, a conductor for a reference clock (REFCLK) signal, or a conductor for a present (PRSNT) signal.

7. The apparatus of claim 1, wherein the one or more sideband signal conductors comprises a conductor for a power break (PWRBRK) signal.

8. The apparatus of claim 1, wherein one of the sideband signals comprise active low signals.

9. The apparatus of claim 1, wherein the pinfield is based on a Peripheral Component Interconnect Express (PCIe) protocol.

10. The apparatus of claim 1, wherein the pinfield is based on an interconnect other than a PCIe-based interconnect.

11. The apparatus of claim 1, wherein the set of sideband signal conductors comprises sideband signal conductors in a range from A12/B12 to A82/B82.

12. A computing device comprising:

a pinfield compliant with a PCIe-based specification, wherein the pinfield comprises:

a set of differential signal conductors to carry differential signals to transmit and receive data on an interface compliant with the PCIe-based specification, wherein the set of different signal conductors correspond to pins of a connector;

a set of ground conductors to correspond to ground pins of the connector;

a set of sideband signal vias to carry one or more of clock signals and sideband signals; and a set of sentry ground vias adjacent to each one of the sideband signal vias in the set of sideband signal vias;

wherein the set of sentry ground vias have a diameter smaller than pins of the connector and smaller than diameters of each one of the sideband signal vias in the set of sideband signal vias.

13. The computing device of claim 12, wherein the set of sideband signal vias comprises one or more of a conductor for a clock request (CLKREQ) signal, a conductor for a reference clock (REFCLK) signal, or a conductor for a present (PRSNT) signal.

14. The computing device of claim 12, wherein the plurality of sentry ground vias comprises at least three sentry ground vias adjacent to a particular one of the sideband signal conductors in the set of sideband signal conductors.

15. The computing device of claim 12, wherein the one or more sideband signal conductors comprises a conductor for a power break (PWRBRK) signal.

16. A system comprising:

a system board comprising:

a pinfield, wherein the pinfield comprises:

a set of one or more conductors to correspond to and carry signals for a set of differential signaling pairs, a set of ground vias;

a set of reference clock signal vias, and two or more sentry ground vias adjacent to each one the reference clock signal vias in the set of reference clock signal vias, wherein the sentry vias are to improve signal integrity;

a connector coupled to the pinfield, wherein the connector comprises pins to be inserted into the set of ground vias and the set of reference clock signal vias; and an add-in card coupled to the system board via the connector;

wherein the two or more sentry ground vias each have a diameter smaller than diameters of the pins of the connector.

17. The system of claim 16, wherein the add-in card is coupled to the system board by the connector.

18. The system of claim 16, wherein the connector comprises one of a thru-hole connector or a press-fit connector.

19. The system of claim 16, wherein the add-in card comprises an endpoint compliant with an interconnect protocol.

20. The system of claim 19, wherein the interconnect protocol comprises a Peripheral Component Interconnect Express (PCIe)-based protocol.

21. The system of claim 16, wherein the add-in card comprises a device to receive clock signals, reset signals, and present signals via the connector coupled to the pinfield.

22. The system of claim 21, wherein the device comprises one of an input-output (I/O) device, an audio processor, a network processor, a data storage device, or a network interface controller (NIC).

23. The system of claim 16, wherein the system comprises a server system.

24. The system of claim 16, wherein the one or more respective sentry vias adjacent to each one the reference clock signal vias in the set of reference clock signal vias comprise a different diameter than the one or more respective sentry vias adjacent to each one of the clock request signal vias in the set of reset signal vias.

25. The system of claim 24, wherein one or more respective sentry vias adjacent to each one of the clock request signal vias in the set of reset signal vias comprises a different diameter than the one or more respective sentry vias adjacent to each one of the present signal vias in the set of present signal vias.

26. The system of claim 16, further comprising:

a set of clock request signal vias;

a set of present signal vias; and two or more respective sentry vias adjacent to each one of the clock request signal vias in the set of clock request signal vias, and two or more respective sentry vias adjacent to each one of the present signal vias in the set of present signal vias;

wherein the two or more sentry ground vias have a diameter smaller than diameters of the clock request signal vias and the present signal vias.

* * * * *